(12) United States Patent
Young et al.

(10) Patent No.: US 10,401,436 B2
(45) Date of Patent: Sep. 3, 2019

(54) TRACKING BATTERY CONDITIONS

(71) Applicant: Hand Held Products, Inc., Fort Mill, SC (US)

(72) Inventors: Timothy Young, Clover, SC (US); John Yeschick, Baldwinsville, NY (US); Timothy Havens, Huntersville, NC (US); Dennis Henry Cudzilo, Camillus, NY (US)

(73) Assignee: Hand Held Products, Inc., Fort Mill, SC (US)

(*) Notice: Subject to any disclaimer, the term of this patent is extended or adjusted under 35 U.S.C. 154(b) by 314 days.

(21) Appl. No.: 14/702,979

(22) Filed: May 4, 2015

(65) Prior Publication Data

US 2016/0327614 A1    Nov. 10, 2016

(51) Int. Cl.
*G01R 31/392* (2019.01)
*G01R 31/3835* (2019.01)
*H02J 7/00* (2006.01)

(52) U.S. Cl.
CPC ....... *G01R 31/392* (2019.01); *G01R 31/3835* (2019.01); *H02J 7/0073* (2013.01)

(58) Field of Classification Search
CPC .. H02J 2007/005; H02J 7/0068; H02J 7/0073; G01R 31/3606; G01R 31/362; G01R 31/382; G01R 31/3828; G01R 31/3835; G01R 31/385; G01R 31/387; G01R 31/388; H01M 10/44; H01M 10/441; H01M 10/448; H01M 10/48; H01M 10/482; H01M 10/484; H01M 10/486
USPC .................. 320/127, 128, 131, 132
See application file for complete search history.

(56) References Cited

U.S. PATENT DOCUMENTS

| | | | |
|---|---|---|---|
| 6,832,725 | B2 | 12/2004 | Gardiner et al. |
| 7,128,266 | B2 | 10/2006 | Marlton et al. |
| 7,159,783 | B2 | 1/2007 | Walczyk et al. |
| 7,413,127 | B2 | 8/2008 | Ehrhart et al. |
| 7,726,575 | B2 | 6/2010 | Wang et al. |

(Continued)

FOREIGN PATENT DOCUMENTS

| | | |
|---|---|---|
| WO | 2013163789 A1 | 11/2013 |
| WO | 2013173985 A1 | 11/2013 |

(Continued)

OTHER PUBLICATIONS

U.S. Appl. No. 13/367,978, filed Feb. 7, 2012, (Feng et al.); now abandoned.

(Continued)

*Primary Examiner* — Nathaniel R Pelton
*Assistant Examiner* — Michael N DiBenedetto
(74) *Attorney, Agent, or Firm* — Additon, Higgins & Pendleton, P.A.

(57) ABSTRACT

A method is described for managing an operating state of a battery energizing a mobile device. Active elements of a "gas gauge" IC component of the mobile device are configured or programmed based on instructions related to tracking capacity aging of the battery. An event is targeted based on the configured or programmed instructions. The targeted event corresponds to reaching an end of a discharge state of the battery, or to reaching a midpoint (relative to full charge) of a charging state of the battery. A relaxation state is induced in the battery upon the targeted event occurring.

20 Claims, 7 Drawing Sheets

(56) References Cited

U.S. PATENT DOCUMENTS

| | | |
|---|---|---|
| 8,294,969 B2 | 10/2012 | Plesko |
| 8,317,105 B2 | 11/2012 | Kotlarsky et al. |
| 8,322,622 B2 | 12/2012 | Suzhou et al. |
| 8,366,005 B2 | 2/2013 | Kotlarsky et al. |
| 8,371,507 B2 | 2/2013 | Haggerty et al. |
| 8,376,233 B2 | 2/2013 | Van Horn et al. |
| 8,381,979 B2 | 2/2013 | Franz |
| 8,390,909 B2 | 3/2013 | Plesko |
| 8,408,464 B2 | 4/2013 | Zhu et al. |
| 8,408,468 B2 | 4/2013 | Horn et al. |
| 8,408,469 B2 | 4/2013 | Good |
| 8,424,768 B2 | 4/2013 | Rueblinger et al. |
| 8,448,863 B2 | 5/2013 | Xian et al. |
| 8,457,013 B2 | 6/2013 | Essinger et al. |
| 8,459,557 B2 | 6/2013 | Havens et al. |
| 8,469,272 B2 | 6/2013 | Kearney |
| 8,474,712 B2 | 7/2013 | Kearney et al. |
| 8,479,992 B2 | 7/2013 | Kotlarsky et al. |
| 8,490,877 B2 | 7/2013 | Kearney |
| 8,517,271 B2 | 8/2013 | Kotlarsky et al. |
| 8,523,076 B2 | 9/2013 | Good |
| 8,528,818 B2 | 9/2013 | Ehrhart et al. |
| 8,544,737 B2 | 10/2013 | Gomez et al. |
| 8,548,420 B2 | 10/2013 | Grunow et al. |
| 8,550,335 B2 | 10/2013 | Samek et al. |
| 8,550,354 B2 | 10/2013 | Gannon et al. |
| 8,550,357 B2 | 10/2013 | Kearney |
| 8,556,174 B2 | 10/2013 | Kosecki et al. |
| 8,556,176 B2 | 10/2013 | Van Horn et al. |
| 8,556,177 B2 | 10/2013 | Hussey et al. |
| 8,559,767 B2 | 10/2013 | Barber et al. |
| 8,561,895 B2 | 10/2013 | Gomez et al. |
| 8,561,903 B2 | 10/2013 | Sauerwein |
| 8,561,905 B2 | 10/2013 | Edmonds et al. |
| 8,565,107 B2 | 10/2013 | Pease et al. |
| 8,571,307 B2 | 10/2013 | Li et al. |
| 8,579,200 B2 | 11/2013 | Samek et al. |
| 8,583,924 B2 | 11/2013 | Caballero et al. |
| 8,584,945 B2 | 11/2013 | Wang et al. |
| 8,587,595 B2 | 11/2013 | Wang |
| 8,587,697 B2 | 11/2013 | Hussey et al. |
| 8,588,869 B2 | 11/2013 | Sauerwein et al. |
| 8,590,789 B2 | 11/2013 | Nahill et al. |
| 8,596,539 B2 | 12/2013 | Havens et al. |
| 8,596,542 B2 | 12/2013 | Havens et al. |
| 8,596,543 B2 | 12/2013 | Havens et al. |
| 8,599,271 B2 | 12/2013 | Havens et al. |
| 8,599,957 B2 | 12/2013 | Peake et al. |
| 8,600,158 B2 | 12/2013 | Li et al. |
| 8,600,167 B2 | 12/2013 | Showering |
| 8,602,309 B2 | 12/2013 | Longacre et al. |
| 8,608,053 B2 | 12/2013 | Meier et al. |
| 8,608,071 B2 | 12/2013 | Liu et al. |
| 8,611,309 B2 | 12/2013 | Wang et al. |
| 8,615,487 B2 | 12/2013 | Gomez et al. |
| 8,621,123 B2 | 12/2013 | Caballero |
| 8,622,303 B2 | 1/2014 | Meier et al. |
| 8,628,013 B2 | 1/2014 | Ding |
| 8,628,015 B2 | 1/2014 | Wang et al. |
| 8,628,016 B2 | 1/2014 | Winegar |
| 8,629,926 B2 | 1/2014 | Wang |
| 8,630,491 B2 | 1/2014 | Longacre et al. |
| 8,635,309 B2 | 1/2014 | Berthiaume et al. |
| 8,636,200 B2 | 1/2014 | Kearney |
| 8,636,212 B2 | 1/2014 | Nahill et al. |
| 8,636,215 B2 | 1/2014 | Ding et al. |
| 8,636,224 B2 | 1/2014 | Wang |
| 8,638,806 B2 | 1/2014 | Wang et al. |
| 8,640,958 B2 | 2/2014 | Lu et al. |
| 8,640,960 B2 | 2/2014 | Wang et al. |
| 8,643,717 B2 | 2/2014 | Li et al. |
| 8,646,692 B2 | 2/2014 | Meier et al. |
| 8,646,694 B2 | 2/2014 | Wang et al. |
| 8,657,200 B2 | 2/2014 | Ren et al. |
| 8,659,397 B2 | 2/2014 | Vargo et al. |
| 8,668,149 B2 | 3/2014 | Good |
| 8,678,285 B2 | 3/2014 | Kearney |
| 8,678,286 B2 | 3/2014 | Smith et al. |
| 8,682,077 B1 | 3/2014 | Longacre |
| D702,237 S | 4/2014 | Oberpriller et al. |
| 8,687,282 B2 | 4/2014 | Feng et al. |
| 8,692,927 B2 | 4/2014 | Pease et al. |
| 8,695,880 B2 | 4/2014 | Bremer et al. |
| 8,698,949 B2 | 4/2014 | Grunow et al. |
| 8,702,000 B2 | 4/2014 | Barber et al. |
| 8,717,494 B2 | 5/2014 | Gannon |
| 8,720,783 B2 | 5/2014 | Biss et al. |
| 8,723,804 B2 | 5/2014 | Fletcher et al. |
| 8,723,904 B2 | 5/2014 | Marty et al. |
| 8,727,223 B2 | 5/2014 | Wang |
| 8,740,082 B2 | 6/2014 | Wilz |
| 8,740,085 B2 | 6/2014 | Furlong et al. |
| 8,746,563 B2 | 6/2014 | Hennick et al. |
| 8,750,445 B2 | 6/2014 | Peake et al. |
| 8,752,766 B2 | 6/2014 | Xian et al. |
| 8,756,059 B2 | 6/2014 | Braho et al. |
| 8,757,495 B2 | 6/2014 | Qu et al. |
| 8,760,563 B2 | 6/2014 | Koziol et al. |
| 8,736,909 B2 | 7/2014 | Reed et al. |
| 8,777,108 B2 | 7/2014 | Coyle |
| 8,777,109 B2 | 7/2014 | Oberpriller et al. |
| 8,779,898 B2 | 7/2014 | Havens et al. |
| 8,781,520 B2 | 7/2014 | Payne et al. |
| 8,783,573 B2 | 7/2014 | Havens et al. |
| 8,789,757 B2 | 7/2014 | Barten |
| 8,789,758 B2 | 7/2014 | Hawley et al. |
| 8,789,759 B2 | 7/2014 | Xian et al. |
| 8,794,520 B2 | 8/2014 | Wang et al. |
| 8,794,522 B2 | 8/2014 | Ehrhart |
| 8,794,525 B2 | 8/2014 | Amundsen et al. |
| 8,794,526 B2 | 8/2014 | Wang et al. |
| 8,798,367 B2 | 8/2014 | Ellis |
| 8,807,431 B2 | 8/2014 | Wang et al. |
| 8,807,432 B2 | 8/2014 | Van Horn et al. |
| 8,820,630 B2 | 9/2014 | Qu et al. |
| 8,822,848 B2 | 9/2014 | Meagher |
| 8,824,692 B2 | 9/2014 | Sheerin et al. |
| 8,824,696 B2 | 9/2014 | Braho |
| 8,842,849 B2 | 9/2014 | Wahl et al. |
| 8,844,822 B2 | 9/2014 | Kotlarsky et al. |
| 8,844,823 B2 | 9/2014 | Fritz et al. |
| 8,849,019 B2 | 9/2014 | Li et al. |
| D716,285 S | 10/2014 | Chaney et al. |
| 8,851,383 B2 | 10/2014 | Yeakley et al. |
| 8,854,633 B2 | 10/2014 | Laffargue |
| 8,866,963 B2 | 10/2014 | Grunow et al. |
| 8,868,421 B2 | 10/2014 | Braho et al. |
| 8,868,519 B2 | 10/2014 | Maloy et al. |
| 8,868,802 B2 | 10/2014 | Barten |
| 8,868,803 B2 | 10/2014 | Bremer et al. |
| 8,870,074 B1 | 10/2014 | Gannon |
| 8,879,639 B2 | 11/2014 | Sauerwein |
| 8,880,426 B2 | 11/2014 | Smith |
| 8,881,983 B2 | 11/2014 | Havens et al. |
| 8,881,987 B2 | 11/2014 | Wang |
| 8,903,172 B2 | 12/2014 | Smith |
| 8,908,995 B2 | 12/2014 | Benos et al. |
| 8,910,870 B2 | 12/2014 | Li et al. |
| 8,910,875 B2 | 12/2014 | Ren et al. |
| 8,914,290 B2 | 12/2014 | Hendrickson et al. |
| 8,914,788 B2 | 12/2014 | Pettinelli et al. |
| 8,915,439 B2 | 12/2014 | Feng et al. |
| 8,915,444 B2 | 12/2014 | Havens et al. |
| 8,916,789 B2 | 12/2014 | Woodburn |
| 8,918,250 B2 | 12/2014 | Hollifield |
| 8,918,564 B2 | 12/2014 | Caballero |
| 8,925,818 B2 | 1/2015 | Kosecki et al. |
| 8,939,374 B2 | 1/2015 | Jovanovski et al. |
| 8,942,480 B2 | 1/2015 | Ellis |
| 8,944,313 B2 | 2/2015 | Williams et al. |
| 8,944,327 B2 | 2/2015 | Meier et al. |
| 8,944,332 B2 | 2/2015 | Harding et al. |
| 8,950,678 B2 | 2/2015 | Germaine et al. |
| D723,560 S | 3/2015 | Zhou et al. |

(56) References Cited

U.S. PATENT DOCUMENTS

| | | |
|---|---|---|
| 8,967,468 B2 | 3/2015 | Gomez et al. |
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 2004/0222769 A1* | 11/2004 | Al-Anbuky .......... H02J 7/0072 320/128 |
| 2007/0063048 A1 | 3/2007 | Havens et al. |
| 2009/0134221 A1 | 5/2009 | Zhu et al. |
| 2009/0256528 A1* | 10/2009 | Greening .......... H01M 10/0525 320/162 |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2011/0169999 A1 | 7/2011 | Grunow et al. |
| 2011/0202554 A1 | 8/2011 | Powilleit et al. |
| 2012/0111946 A1 | 5/2012 | Golant |
| 2012/0168512 A1 | 7/2012 | Kotlarsky et al. |
| 2012/0193423 A1 | 8/2012 | Samek |
| 2012/0203647 A1 | 8/2012 | Smith |
| 2012/0223141 A1 | 9/2012 | Good et al. |
| 2013/0043312 A1 | 2/2013 | Van Horn |
| 2013/0075168 A1 | 3/2013 | Amundsen et al. |
| 2013/0175341 A1 | 7/2013 | Kearney et al. |
| 2013/0175343 A1 | 7/2013 | Good |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0287258 A1 | 10/2013 | Kearney |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308625 A1 | 11/2013 | Corcoran |
| 2013/0313324 A1 | 11/2013 | Koziol et al. |
| 2013/0313325 A1 | 11/2013 | Wilz et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |
| 2014/0025584 A1 | 1/2014 | Liu et al. |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061306 A1 | 3/2014 | Wu et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0098792 A1 | 4/2014 | Wang et al. |
| 2014/0100774 A1 | 4/2014 | Showering |
| 2014/0100813 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Li et al. |
| 2014/0104451 A1 | 4/2014 | Todeschini et al. |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0121438 A1 | 5/2014 | Kearney |
| 2014/0121445 A1 | 5/2014 | Ding et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131441 A1 | 5/2014 | Nahill et al. |
| 2014/0131443 A1 | 5/2014 | Smith |
| 2014/0131444 A1 | 5/2014 | Wang |
| 2014/0131448 A1 | 5/2014 | Xian et al. |
| 2014/0133379 A1 | 5/2014 | Wang et al. |
| 2014/0136208 A1 | 5/2014 | Maltseff et al. |
| 2014/0140585 A1 | 5/2014 | Wang |
| 2014/0151453 A1 | 6/2014 | Meier et al. |
| 2014/0152882 A1 | 6/2014 | Samek et al. |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0191644 A1 | 7/2014 | Chaney |
| 2014/0191913 A1 | 7/2014 | Ge et al. |
| 2014/0197238 A1 | 7/2014 | Lui et al. |

(56) References Cited

U.S. PATENT DOCUMENTS

| | | |
|---|---|---|
| 2014/0197239 A1 | 7/2014 | Havens et al. |
| 2014/0197304 A1 | 7/2014 | Feng et al. |
| 2014/0203087 A1 | 7/2014 | Smith et al. |
| 2014/0204268 A1 | 7/2014 | Grunow et al. |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0231500 A1 | 8/2014 | Ehrhart et al. |
| 2014/0232930 A1 | 8/2014 | Anderson |
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0270196 A1 | 9/2014 | Braho et al. |
| 2014/0270229 A1 | 9/2014 | Braho |
| 2014/0278387 A1 | 9/2014 | DiGregorio |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0312121 A1 | 10/2014 | Lu et al. |
| 2014/0319220 A1 | 10/2014 | Coyle |
| 2014/0319221 A1 | 10/2014 | Oberpriller et al. |
| 2014/0326787 A1 | 11/2014 | Barten |
| 2014/0332590 A1 | 11/2014 | Wang et al. |
| 2014/0344943 A1 | 11/2014 | Todeschini et al. |
| 2014/0346233 A1 | 11/2014 | Liu et al. |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0035475 A1* | 2/2015 | Li ................. H02J 7/0029 320/107 |
| 2015/0039309 A1 | 2/2015 | Braho et al. |
| 2015/0040378 A1 | 2/2015 | Saber et al. |
| 2015/0048168 A1 | 2/2015 | Fritz et al. |
| 2015/0048801 A1* | 2/2015 | Kessler ........... G01R 31/3624 320/149 |
| 2015/0049347 A1 | 2/2015 | Laffargue et al. |
| 2015/0051992 A1 | 2/2015 | Smith |
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0062366 A1 | 3/2015 | Liu et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0071818 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0127791 A1 | 5/2015 | Kosecki et al. |
| 2015/0128116 A1 | 5/2015 | Chen et al. |
| 2015/0129659 A1 | 5/2015 | Feng et al. |
| 2015/0133047 A1 | 5/2015 | Smith et al. |
| 2015/0134470 A1 | 5/2015 | Hejl et al. |
| 2015/0136851 A1 | 5/2015 | Harding et al. |
| 2015/0136854 A1 | 5/2015 | Lu et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0144701 A1 | 5/2015 | Xian et al. |
| 2015/0149946 A1 | 5/2015 | Benos et al. |
| 2015/0161429 A1 | 6/2015 | Xian |
| 2015/0169925 A1 | 6/2015 | Chang et al. |
| 2015/0169929 A1 | 6/2015 | Williams et al. |
| 2015/0186703 A1 | 7/2015 | Chen et al. |
| 2015/0193644 A1 | 7/2015 | Kearney et al. |
| 2015/0193645 A1 | 7/2015 | Colavito et al. |
| 2015/0199957 A1 | 7/2015 | Funyak et al. |
| 2015/0204671 A1 | 7/2015 | Showering |

FOREIGN PATENT DOCUMENTS

| | | |
|---|---|---|
| WO | 2014019130 A1 | 2/2014 |
| WO | 2014110495 A1 | 7/2014 |

OTHER PUBLICATIONS

U.S. Appl. No. 14/462,801 for Mobile Computing Device With Data Cognition Software, filed Aug. 19, 2014 (Todeschini et al.); 38 pages.

U.S. Appl. No. 14/596,757 for System and Method for Detecting Barcode Printing Errors filed Jan. 14, 2015 (Ackley); 41 pages.

U.S. Appl. No. 14/277,337 for Multipurpose Optical Reader, filed May 14, 2014 (Jovanovski et al.); 59 pages.

U.S. Appl. No. 14/200,405 for Indicia Reader for Size-Limited Applications filed Mar. 7, 2014 (Feng et al.); 42 pages.

U.S. Appl. No. 14/662,922 for Multifunction Point of Sale System filed Mar. 19, 2015 (Van Horn et al.); 41 pages.

U.S. Appl. No. 14/446,391 for Multifunction Point of Sale Apparatus With Optical Signature Capture filed Jul. 30, 2014 (Good et al.); 37 pages.

U.S. Appl. No. 29/528,165 for In-Counter Barcode Scanner filed May 27, 2015 (Oberpriller et al.); 13 pages.

U.S. Appl. No. 29/528,890 for Mobile Computer Housing filed Jun. 2, 2015 (Fitch et al.); 61 pages.

U.S. Appl. No. 14/614,796 for Cargo Apportionment Techniques filed Feb. 5, 2015 (Morton et al.); 56 pages.

U.S. Appl. No. 29/516,892 for Table Computer filed Feb. 6, 2015 (Bidwell et al.); 13 pages.

U.S. Appl. No. 29/523,098 for Handle for a Tablet Computer filed Apr. 7, 2015 (Bidwell et al.); 17 pages.

U.S. Appl. No. 14/578,627 for Safety System and Method filed Dec. 22, 2014 (Ackley et al.); 32 pages.

U.S. Appl. No. 14/573,022 for Dynamic Diagnostic Indicator Generation filed Dec. 17, 2014 (Goldsmith); 43 pages.

U.S. Appl. No. 14/529,857 for Barcode Reader With Security Features filed Oct. 31, 2014 (Todeschini et al.); 32 pages.

U.S. Appl. No. 14/519,195 for Handheld Dimensioning System With Feedback filed Oct. 21, 2014 (Laffargue et al.); 39 pages.

U.S. Appl. No. 14/519,211 for System and Method for Dimensioning filed Oct. 21, 2014 (Ackley et al.); 33 pages.

U.S. Appl. No. 14/519,233 for Handheld Dimensioner With Data-Quality Indication filed Oct. 21, 2014 (Laffargue et al.); 36 pages.

U.S. Appl. No. 14/533,319 for Barcode Scanning System Using Wearable Device With Embedded Camera filed Nov. 5, 2014 (Todeschini); 29 pages.

U.S. Appl. No. 14/748,446 for Cordless Indicia Reader With a Multifunction Coil for Wireless Charging and EAS Deactivation, filed Jun. 24, 2015 (Xie et al.); 34 pages.

U.S. Appl. No. 29/528,590 for Electronic Device filed May 29, 2015 (Fitch et al.); 9 pages.

U.S. Appl. No. 14/519,249 for Handheld Dimensioning System With Measurement-Conformance Feedback filed Oct. 21, 2014 (Ackley et al.); 36 pages.

(56) References Cited

OTHER PUBLICATIONS

U.S. Appl. No. 29/519,017 for Scanner filed Mar. 2, 2015 (Zhou et al.); 11 pages.
U.S. Appl. No. 14/398,542 for Portable Electronic Devices Having a Separate Location Trigger Unit for Use in Controlling an Application Unit filed Nov. 3, 2014 (Bian et al.); 22 pages.
U.S. Appl. No. 14/405,278 for Design Pattern for Secure Store filed Mar. 9, 2015 (Zhu et al.); 23 pages.
U.S. Appl. No. 14/590,024 for Shelving and Package Locating Systems for Delivery Vehicles filed Jan. 6, 2015 (Payne); 31 pages.
U.S. Appl. No. 14/568,305 for Auto-Contrast Viewfinder for an Indicia Reader filed Dec. 12, 2014 (Todeschini); 29 pages.
U.S. Appl. No. 29/526,918 for Charging Base filed May 14, 2015 (Fitch et al.); 10 pages.
U.S. Appl. No. 14/580,262 for Media Gate for Thermal Transfer Printers filed Dec. 23, 2014 (Bowles); 36 pages.
U.S. Appl. No. 14/519,179 for Dimensioning System With Multipath Interference Mitigation filed Oct. 21, 2014 (Thuries et al.); 30 pages.
U.S. Appl. No. 14/264,173 for Autofocus Lens System for Indicia Readers filed April 29, 2014, (Ackley et al.); 39 pages.
U.S. Appl. No. 14/453,019 for Dimensioning System With Guided Alignment, filed Aug. 6, 2014 (Li et al.); 31 pages.
U.S. Appl. No. 14/452,697 for Interactive Indicia Reader , filed Aug. 6, 2014, (Todeschini); 32 pages.
U.S. Appl. No. 14/231,898 for Hand-Mounted Indicia-Reading Device with Finger Motion Triggering filed Apr. 1, 2014 (Van Horn et al.); 36 pages
U.S. Appl. No. 14/715,916 for Evaluating Image Values filed May 19, 2015 (Ackley); 60 pages.
U.S. Appl. No. 14/513,808 for Identifying Inventory Items in a Storage Facility filed Oct. 14, 2014 (Singel et al.); 51 pages.
U.S. Appl. No. 29/458,405 for an Electronic Device, filed Jun. 19, 2013 (Fitch et al.); 22 pages.
U.S. Appl. No. 29/459,620 for an Electronic Device Enclosure, filed Jul. 2, 2013 (London et al.); 21 pages.
U.S. Appl. No. 14/483,056 for Variable Depth of Field Barcode Scanner filed Sep. 10, 2014 (McCloskey et al.); 29 pages.
U.S. Appl. No. 14/531,154 for Directing an Inspector Through an Inspection filed Nov. 3, 2014 (Miller et al.); 53 pages.
U.S. Appl. No. 29/525,068 for Tablet Computer With Removable Scanning Device filed Apr. 27, 2015 (Schulte et al.); 19 pages.
U.S. Appl. No. 29/468,118 for an Electronic Device Case, filed Sep. 26, 2013 (Oberpriller et al.); 44 pages.
U.S. Appl. No. 14/340,627 for an Axially Reinforced Flexible Scan Element, filed Jul. 25, 2014 (Reublinger et al.); 41 pages.
U.S. Appl. No. 14/676,327 for Device Management Proxy for Secure Devices filed Apr. 1, 2015 (Yeakley et al.); 50 pages.
U.S. Appl. No. 14/257,364 for Docking System and Method Using Near Field Communication filed Apr. 21, 2014 (Showering); 31 pages.
U.S. Appl. No. 14/327,827 for a Mobile-Phone Adapter for Electronic Transactions, filed Jul. 10, 2014 (Hejl); 25 pages.
U.S. Appl. No. 14/334,934 for a System and Method for Indicia Verification, filed Jul. 18, 2014 (Hejl); 38 pages.
U.S. Appl. No. 29/530,600 for Cyclone filed Jun. 18, 2015 (Vargo et al); 16 pages.
U.S. Appl. No. 14/707,123 for Application Independent DEX/UCS Interface filed May 8, 2015 (Pape); 47 pages.

U.S. Appl. No. 14/283,282 for Terminal Having Illumination and Focus Control filed May 21, 2014 (Liu et al.); 31 pages.
U.S. Appl. No. 14/619,093 for Methods for Training a Speech Recognition System filed Feb. 11, 2015 (Pecorari); 35 pages.
U.S. Appl. No. 29/524,186 for Scanner filed Apr. 17, 2015 (Zhou et al.); 17 pages.
U.S. Appl. No. 14/705,407 for Method and System to Protect Software-Based Network-Connected Devices From Advanced Persistent Threat filed May 6, 2015 (Hussey et al.); 42 pages.
U.S. Appl. No. 14/614,706 for Device for Supporting an Electronic Tool on a User's Hand filed Feb. 5, 2015 (Oberpriller et al.); 33 pages
U.S. Appl. No. 14/628,708 for Device, System, and Method for Determining the Status of Checkout Lanes filed Feb. 23, 2015 (Todeschini); 37 pages.
U.S. Appl. No. 14/704,050 for Intermediate Linear Positioning filed May 5, 2015 (Charpentier et al.); 60 pages.
U.S. Appl. No. 14/529,563 for Adaptable Interface for a Mobile Computing Device filed Oct. 31, 2014 (Schoon et al.); 36 pages.
U.S. Appl. No. 14/705,012 for Hands-Free Human Machine Interface Responsive to a Driver of a Vehicle filed May 6, 2015 (Fitch et al.); 44 pages.
U.S. Appl. No. 14/715,672 for Augumented Reality Enabled Hazard Display filed May 19, 2015 (Venkatesha et al.); 35 pages.
U.S. Appl. No. 14/695,364 for Medication Management System filed Apr. 24, 2015 (Sewell et al.); 44 pages.
U.S. Appl. No. 14/664,063 for Method and Application for Scanning a Barcode With a Smart Device While Continuously Running and Displaying an Application on the Smart Device Display filed Mar. 20, 2015 (Todeschini); 37 pages.
U.S. Appl. No. 14/735,717 for Indicia-Reading Systems Having an Interface With a User's Nervous System filed Jun. 10, 2015 (Todeschini); 39 pages.
U.S. Appl. No. 14/527,191 for Method and System for Recognizing Speech Using Wildcards in an Expected Response filed Oct. 29, 2014 (Braho et al.); 45 pages.
U.S. Appl. No. 14/702,110 for System and Method for Regulating Barcode Data Injection Into a Running Application on a Smart Device filed May 1, 2015 (Todeschini et al.); 38 pages.
U.S. Appl. No. 14/535,764 for Concatenated Expected Responses for Speech Recognition filed Nov. 7, 2014 (Braho et al.); 51 pages.
U.S. Appl. No. 14/687,289 for System for Communication Via a Peripheral Hub filed Apr. 15, 2015 (Kohtz et al.); 37 pages.
U.S. Appl. No. 14/747,197 for Optical Pattern Projector filed Jun. 23, 2015 (Thuries et al.); 33 pages.
U.S. Appl. No. 14/674,329 for Aimer for Barcode Scanning filed Mar. 31, 2015 (Bidwell); 36 pages.
U.S. Appl. No. 14/702,979 for Tracking Battery Conditions filed May 4, 2015 (Young et al.); 70 pages.
U.S. Appl. No. 29/529,441 for Indicia Reading Device filed Jun. 8, 2015 (Zhou et al.); 14 pages.
U.S. Appl. No. 14/747,490 for Dual-Projector Three-Dimensional Scanner filed Jun. 23, 2015 (Jovanovski et al.); 40 pages.
U.S. Appl. No. 14/740,320 for Tactile Switch for a Mobile Electronic Device filed Jun. 16, 2015 (Barndringa); 38 pages.
U.S. Appl. No. 14/695,923 for Secure Unattended Network Authentication filed Apr. 24, 2015 (Kubler et al.); 52 pages.
U.S. Appl. No. 14/740,373 for Calibrating a Volume Dimensioner filed Jun. 16, 2015 (Ackley et al.); 63 pages.

* cited by examiner

TRACKING BATTERY CONDITIONS

TECHNOLOGY FIELD

The present invention relates generally to batteries. More specifically, an embodiment of the present disclosure relates to tracking battery conditions.

BACKGROUND

Generally speaking, contemporary mobile devices such as portable data terminals (PDTs), smartphones, personal digital assistants (PDAs), and tablet style computers operate on electrical power provided by batteries. Various electrical (and other physical) parameters relate to conditions of the batteries. The batteries discharge as current is drawn from them by the mobile devices they energize. The power drawn from the batteries is replenished as the batteries charge.

As the batteries discharge and charge, the parameters change in real time. Some of the parameters also change over longer periods, relative to the real time changes. Further, aging and wear cause long-term battery condition changes, which relate to changes in electrical, electrochemical, and physical characteristics of components of the battery.

The condition of a battery has significant effects on its performance and reliability, and that of a mobile device it energizes. Mobile devices may thus monitor the battery condition related parameters. Some modern mobile devices comprise an integrated circuit (IC) component operable for monitoring the battery condition related parameters. The battery condition related monitoring operations of the IC component comprise sensing the parameters in real time, tracking the changes in the parameters both in real time and over longer terms, and reporting condition related indications based on the tracked parameters. The battery parameter monitoring IC component is referred to herein as a "gas gauge chip" or "gas gauge" (e.g., analogizing, in an imaginative sense, vehicular fuel gauges).

For example, the gas gauge chips may be operable for real time sensing of the battery voltage and temperature parameters and reporting a corresponding 'voltage level' indication in Millivolt (mV) units and a corresponding 'temperature' indication in degrees Celsius (° C.). The gas gauge may also be operable for tracking the sensed parameters as they change over a time period and, based on characteristics of the battery with which it is programmed, for reporting a related performance indication. For example, the gas gauge may be operable for computing and reporting a 'remaining battery capacity' in Milliamp Hour (mAh) units and a 'remaining run-time' (e.g., for full operability of the mobile device it energizes) in minutes (min.) or other time units.

At any given time, a 'state' of the battery reflects a totality of its various electrochemical, electrical, and physical characteristics. By sensing parameters relating to some of the characteristics, the gas gauge is operable for monitoring the battery states over time. Moreover, the gas gauge chip may be designed, programmed, or configured to compute an algorithm, with which it is operable for tracking age related changes to the battery capacity and other capabilities. In the computations for tracking aging, the gas gauge is operable for distinguishing between various battery states, each corresponding to a particular mode of battery operation.

For example, during a mode of operation in which the battery is being charged electric current flows generally into the battery from an energy source and the battery assumes a state corresponding to a 'charge' mode. During an operating mode in which the battery is being discharged, electric current is generally drawn from the battery by the operating components of the mobile device it energizes. The state of the battery at various points in the 'discharge' mode differs from its state at various points while in its charge mode. Distinguishing between the battery states corresponding to the charge mode and the discharge mode is significant in the monitoring of the battery states and their tracking over time.

Distinguishing a relaxation state of the battery among its operating modes is also significant in the gas gauge battery state monitoring and tracking computations. The 'relax' state corresponds to a mode of its operation in which no current, zero (0) mA, flows from or to the battery. The relaxation state of the battery is typically associated with a suspension of operations by the mobile device it energizes, also referred to as a 'suspend' of the device. However, operations of the mobile device include use cases wherein the device is not allowed to suspend.

For example, suspending the mobile device may be deterred or inhibited during selected operations that sustain wireless communication. The sustained wireless operations use active radio components of the mobile device. The active radio components remain energized and thus, continue to draw power from the battery. While retaining active radio functionality, the suspension of the mobile device is prevented and the battery cannot enter a relaxation mode.

Preventing the battery from relaxing persistently, continuously, frequently, or repeatedly degrades the accurate tracking of the aging of the battery. Degraded age-tracking accuracy decreases reliability of the battery and the mobile device, because it disrupts a 'self-determination' awareness of an approaching end of the useful battery lifetime. At the end of its useful life, the battery lacks a remaining capacity sufficient to sustain full operability of the mobile device it energizes.

The self-determination by the battery package of aging and impending end of useful life can otherwise provide an indication internal to the mobile device. The 'inside the device' indication allows users or maintenance technicians to plan and intervene with timely battery replacement. But without the 'inside the device' indication that its battery is worn out provided by accurate age and wear tracking, the mobile device may fail unexpectedly. Unexpected failure of the device degrades and/or interrupts its operations suddenly and without warning, with concomitant loss or compromise of data, communication, and related mission failure.

Issues or approaches discussed above within this background section may, but not necessarily have been observed or pursued previously. Unless otherwise indicated to the contrary, it is not to be assumed that anything in this section corresponds to any alleged prior art merely by inclusion in this section.

SUMMARY

A need thus exists for accurate tracking a condition of batteries, which energize mobile devices, in relation to aging and corresponding changes in their capacity. A need also exists for allowing to relax on a consistent and reliable basis. Further, a need exists for providing an awareness within the mobile devices of age related condition changes in the battery, including capacity degradation, and approach of the end of the useful lifetime of the batteries.

Accordingly, in one aspect, the present invention embraces tracking aging of the capacity of mobile device batteries, which energize mobile devices. An example embodiment relates to a method for inducing relaxation states in mobile device batteries consistently and reliably, which allows accurate calibration and/or updating of the tracking of the capacity aging tracking. 'Gas gauge' IC chips may thus provide an inside-the-device awareness of age related condition changes in the batteries with which the mobile devices are energized.

An example embodiment relates to a computer-implemented method for managing an operating state of a battery energizing a mobile device. Active elements of the gas gauge IC component of the mobile device are configured and/or programmed based on instructions, which relate to tracking capacity aging of the battery. An event is targeted based on the configured or programmed instructions. The targeted event corresponds to reaching an end of a discharge state of the battery, or to reaching a midpoint (relative to a full charge) of a charging state of the battery. A relaxation state is induced in the battery upon the targeted event occurring.

In an example embodiment, the configuring and/or programming the one or more of active elements comprises setting a value corresponding to the end of a full discharge of the battery, or to the battery charging state mid-point (relative to full charge). The targeted event may occur with the mobile device coupled to a docking station, which is operable for charging the battery. Thus, embodiments of the present invention provide battery relaxation states consistently and reliably, and avoid interruption or inhibition of the relaxations or associated device suspensions.

In an example embodiment, the induced relaxation state may be sustained. The sustaining the induced relaxation state may comprise sensing a voltage level of the battery during the induced relaxation state. A rate of change of the sensed voltage level may be computed. A release of the battery from the induced relaxation state may be deterred unless and/or until the computed rate of change of the sensed voltage level meets a stability target. The stability target may relate to a maximum allowable rate of the voltage level change. An example embodiment may be implemented in which the stability target corresponds to a maximum allowable voltage level change rate of one Microvolt per second (1 µV/sec.).

The induced relaxation state may comprise a first induced relaxation state. Upon releasing the battery from the induced relaxation state, the battery may be charged or discharged, selectively, to a capacity value of at least 30 percent of an original capacity of the battery over a continuous time span. Another (e.g., second) relaxation state may then be induced. The aging related tracking may then be calibrated, e.g., in relation to an update and/or a correction.

During the induced relaxation states, the battery voltage level may be validated as comprising a value between, approximately, a fifth (20%) of a full charge battery voltage level and a half (50%) of the full charge battery voltage level, inclusive. The calibration of the battery capacity aging may be performed upon completing the validating step. The targeted event for inducing a relaxation may further comprise, optionally, an end of a full charge state of the battery.

An example embodiment may be implemented in which the instructions, with which the gas gauge IC elements are configured/programmed, are tangibly embodied in one or more non-transitory computer-readable storage media. The instructions may comprise modules, components, objects, or other code of a software program stored in the non-transitory media. The non-transitory storage media may comprise addressable memory and/or at least a portion of active elements (e.g., transistors) of a microprocessor, microcontroller, programmable logic device (PLD), field-programmable gate array (FPGA), application-specific IC (ASIC) and/or power management-related component of the mobile device.

Another aspect embraces an IC component of the mobile device. The IC component comprises a plurality of (multiple) active devices, such as transistors. In an example embodiment, one or more a portion of the active elements are programmed and/or configured based on instructions relating to the tracking aging of the capacity of mobile device batteries. The instructions cause or control performance of the method for inducing relaxation states in mobile device, which allows accurate tracking of the battery capacity aging.

Based on the programmed/configured instructions, the gas gauge IC chip targets an event. The targeted event corresponds to reaching the end of the discharge state of the battery, or to reaching a midpoint (relative to the full charge) of the charging state of the battery. The relaxation state is induced in the battery upon the targeted event occurring. The gas gauge IC chips may thus provide an inside-the-device awareness of age related condition changes in the batteries with which the mobile devices are energized.

Yet another aspect embraces a power system for the mobile device. An example embodiment relates to a mobile device power system comprising the battery, which is operable for energizing the power system. The mobile device power system also comprises an IC component operable as a gas gauge of the mobile device battery. The gas gauge IC component of the mobile device is programmed and/or configured based on instructions relating to the tracking aging of the capacity of mobile device batteries. The instructions cause or control performance of the method for inducing relaxation states in mobile device, which allows accurate tracking of the battery capacity aging.

Based on the programmed/configured instructions, the gas gauge IC chip targets an event. The targeted event corresponds to reaching the end of the discharge state of the battery, and/or to reaching a midpoint (relative to the full charge) of the charging state of the battery. The relaxation state is induced in the battery upon the targeted event occurring. The gas gauge IC chips may thus provide an inside-the-device awareness of age related condition changes in the batteries with which the mobile devices are energized.

DETAILED DESCRIPTION OF EXAMPLE EMBODIMENTS

Figure 1:
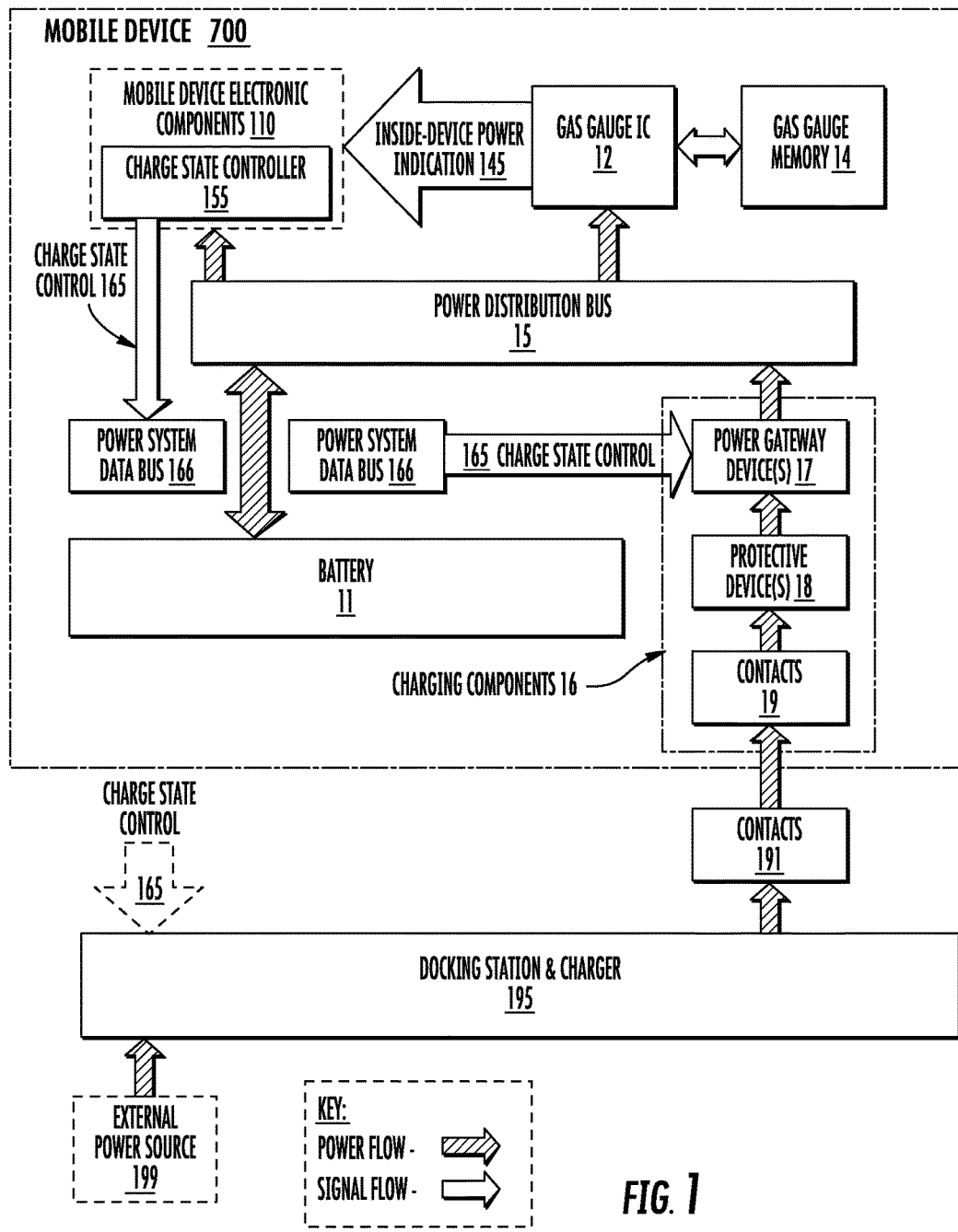
FIG. 1 depicts an example mobile device power system, according to an embodiment of the present invention.

Example embodiments of the present invention are described in relation to tracking aging of the capacity of batteries, which energize mobile devices. An example embodiment relates to a method for inducing relaxation states in mobile device batteries consistently and reliably, which allows accurate calibration and/or updating of the tracking of the capacity aging tracking. 'Gas gauge' IC chips may thus provide an inside-the-device awareness of age related condition changes in the batteries with which the mobile devices are energized.

An example embodiment relates to a computer-implemented method for managing an operating state of a battery energizing a mobile device. Active elements of the gas gauge IC component of the mobile device are configured and/or programmed based on instructions, which relate to tracking capacity aging of the battery. An event is targeted based on the configured or programmed instructions. The targeted event corresponds to reaching an end of a discharge state of the battery, or to reaching a midpoint (relative to a full charge) of a charging state of the battery. A relaxation state is induced in the battery upon the targeted event occurring.

Overview.

An example embodiment of the present invention may be implemented in which software induces a relaxation state for a mobile device battery, which allows a calibration process within a gas gauge IC controller component of the mobile device to track aging of the battery accurately and correctly. The relaxation states, also referred to as "relaxations," are induced upon the occurrence of targeted events. The induced relaxations correct the gas gauge chip's tracking of the capacity aging and restores accurate the inside-the-device indication of battery wear and the self-determination of an approaching end of useful battery life.

Features of the gas gauge chip enlarge its operational range for the tracking of the battery capacity aging. The gas gauge chip comprises multiple configurable and/or programmable active devices. At least a portion of the multiple active devices are configured/programmed based on instructions for inducing the relaxations and calibrating the capacity age tracking. The gas gauge chip facilities may comprise one or more transistors, registers, latches, gates, memory cells, or other facilities, and/or arrays of any such features.

For example, one or more existing undefined, hidden, undocumented, unused, facilities within existing gas gauge chips may be modified by the configuration/programming. The modified configurations of the gas gauge chip facilities are operable for controlling the battery state. In an example embodiment, the controlling the battery state may induce (e.g., prompt, trigger, cause) a battery relaxation upon either of two (2) events occurring in relation to the battery discharge mode, and its charge mode, respectively.

Example embodiments induce battery relaxations at the end of a discharge cycle, or during a charging cycle upon the battery reaching a predefined fraction (e.g., 30%) of its full charge. The induced relaxation may then persist, sustained by the gas gauge chip, unless and/or until the chip senses that significant degree of battery voltage level stability is achieved. The stable battery voltage corresponds to a very low rate of variation, e.g., not exceeding one Microvolt per second (1 µV/sec).

The gas gauge chip updates the battery age tracking calibration upon completing two (2) relax times with validated voltage readings, each of the relaxations separated by continuous charging or discharging of at least 30% of an original capacity of the battery. The validated voltage readings correspond to stabilized voltages outside a disqualification range, which is predefined within the gas gauge IC. The validated voltage readings may span a validity range, e.g., 3740 mV-3815 mV, inclusive, which may correspond, inclusively, to approximately 20%-49% of the full charge battery voltage level.

In an example embodiment, the relaxation may be induced at the end of a discharge cycle, when the mobile device is docked. Additionally or alternatively, the relaxation may be induced while in the midst of a charging cycle. For example, the relaxation may be induced during the charging cycle upon the battery reaching a predefined percentage (or other fraction) of its full charge. The percentage of full charge may be controlled based on a programmed register setting. Additionally or alternatively, the percentage of full charge may be controlled based on a target value, which may be computed in relation to an estimated optimal voltage level for triggering the relaxation.

Example Mobile Device Power System.

FIG. 1 depicts an example mobile device power system 10, according to an embodiment of the present invention. The power system 10 is operable for providing electrical power to multiple electronic components 110 of a mobile device 700. The power system 10 comprises a battery component 11, which is operable for energizing the power system 10 with direct current (DC) electrical power within a given, specified range of voltage. The power system 10 also comprises a power distribution bus component 15 and a gas gauge IC chip component 12.

The power distribution bus 15 is operable for distributing the DC electrical power, with which the power system 10 is energized, conductively from the battery 11 to the gas gauge IC chip 12 and to a plurality of electronic components 110 of the mobile device 700. The gas gauge chip 12 may comprise a microprocessor, microcontroller, FPGA or other PLD, or ASIC and is operable for monitoring a condition of the battery 11, based on voltage level, rate of change of the voltage level, and other electrical parameters (and optionally, other physical parameters, such as temperature).

The battery 11 has several operating states. The operating states of the battery 11 comprise a 'discharge' state. The discharge state corresponds to operations, in which the battery 11 energizes the power system 11 with DC current flow drawn therefrom and supplied as electrical power, via the power distribution bus 15, to the electronic components 110 of the mobile device 700. The operating states of the battery 11 also comprise a 'charge' state. The charge state corresponds to operations, in which the battery 11 draws electrical current, via charging components 16, from a docking station 195. The docking station 195 is operable for supplying charging current to the battery 11, via the charging components 16, through its conductive contacts 191.

The monitored electrical (and other parameters) may change in real time and/or over the duration of one or more time periods, based on changes related to the operating states of the battery 11. The battery 11 also has a capacity. The capacity relates to a capability of the battery 11 for operably driving a rated amount of current drawn by the mobile device components 110 in its design basis operations, within the specified voltage range, over a duration of a specified time period. The capacity may change over time as the battery 11 ages. The battery capacity may thus degrade over its lifetime due to electrical, physical, and/or electrochemical changes within the battery.

For example, some electrochemical reactions are inherent to operations of the battery 11 as a power source. Other electrochemical reactions, such as oxidation and corrosion, may affect electrical and other physical characteristics of plates, contacts, electrodes and/or other components of the battery 11 as it operates over time. These electrochemical effects may raise an operating temperature, and/or cause or contribute to other physical effects, as the battery 11 operates to sustain given electrical performance parameters.

The increased operating temperature may increase reaction rates and affect other characteristics and consequences of the electrochemical effects, which may be cumulative. Moreover, a positive feedback relationship may develop between the effects, which may accelerate their progress and downstream or dependent consequences. As the effects accumulate over the operating lifetime of the battery 11, they may contribute to age related degradation of its capacity.

Based at least partially on real time monitoring of the voltage and other parameters of the battery 11, the gas gauge IC chip 12 is operable over an extended time period, corresponding to the useful lifetime of the battery 11, for tracking the capacity aging thereof. In an embodiment of the present invention for example, the gas gauge IC chip 12 performs a computer-implemented method for managing an operating state of the battery 11.

Further, the operating states of the battery 11 comprise a relaxation state. The relaxation state corresponds to operations, in which the battery 11 neither provides, nor draws, any current. During a relax state, no current (0 mA) flows from, or flows into the battery 11. The relaxation state of the battery 11 may be associated with a suspension of operations by the mobile device 700. In example embodiments of the present invention, the gas gauge chip 12 further monitors the electrical parameters of the battery 11 during its relaxation states and uses the relaxation states as opportunities for calibrating and correcting its computations in relation to the tracking of the capacity aging of the battery 11.

The gas gauge chip 12 comprises a plurality of active elements (as described below). At least a portion of the active elements of the gas gauge IC component 12 are configured and/or programmed based on instructions, which relate to tracking the capacity aging of the battery 11. An event is targeted based on the configured or programmed instructions. In example embodiments of the present invention, the targeted event corresponds to reaching an end of a discharge state of the battery 11, or to reaching a midpoint or 30% (relative to a full charge) of a charging state of the battery 11. A relaxation state is induced in the battery 11 upon the targeted event occurring.

An embodiment of the present invention thus tracks aging of the capacity of the battery 11 and induces relaxation states in the battery 11 consistently and reliably, which allows accurate calibration and/or updating of the tracking of the capacity aging tracking. The gas gauge IC chip 12 is further operable for providing an awareness of age related condition changes in the battery 11, such as the capacity, as an inside-the-device power indication 145 to one or more of the multiple electronic components 110 of the mobile device 700.

The gas gauge chip 12 may read data from, and write data to, a non-transitory computer readable storage medium such as a gas gauge memory 14. Example embodiments may be implemented in which the gas gauge memory 14 comprises non-transitory storage media external to the gas gauge IC chip 12 and/or internal thereto, such as internal memory cells.

The mobile device 700 may be docked with the docking station 195. The relaxation state may be induced in the battery 11, upon the targeted event occurring, while the mobile device 700 is docked with the charging station 195. Thus, embodiments of the present invention accurately and reliably induce the relaxations, without the relaxations being deterred or stopped by inhibited suspensions of the mobile device 700. The docking station 195 is operable for charging the battery 11. For example, the docking station 195 is connected to an external power source 199, such as a source of alternating current (AC) electricity that may be transformed, rectified and filtered, and supplied to the power system 10 through electrical contacts 191. The external power 199 may also (or alternatively) comprise another DC electrical source or an inductive, e.g., with "wireless" charging means.

The power system 10 comprises charging components 16. The charging components 16 comprise contacts 19, which are operable for coupling conductively with the contacts 191 of the docking station 195. The charging components 16 may also comprise one or more protective devices such as overcurrent fuses and overvoltage and surge protection devices such as metal oxide varistors (MOV) and/or Zener diodes.

A pathway for a flow of electrical charging current from the charger 195 to the battery 11 (e.g., via the power distribution bus 15) may be selectively completed conductively through one or more gateway devices 17. The gateway device(s) may comprise an array of metal oxide semiconducting field effect transistors (MOSFETs), legacy devices such as silicon control rectifiers (SCRs), or other means of selectively changing their conductive states from non-conductive to conductive (and vice versa), based on charge state control signals 165. For example, the charge state control signals 165 may relate to gating the MOSFETs or a triggering the SCRs with a pulse provided, e.g., by a conduction state unijunction transistor (UJT).

The charge state control signals 165 are generated by a charge state controller 155. An example embodiment may be implemented, in which the charge state controller 155 comprises one (or more) of the multiple components 110 of the mobile device 700. Alternatively or additionally, the gas gauge chip may further be operable for generating the charge state control signal 165. The charge state control signal 165 may be promulgated via a power system data bus 166. The charge state control signal 165 may also be provided to the docking station 195.

An example embodiment may also be implemented, in which the inside-the-device power indication 145 is provided to the electronic components 110 of the mobile device 700 via the power system data bus 166. In FIG. 1, power flow is depicted with solid-appearance arrow icons and signal flow is depicted with outlined-appearance arrow icons. The power system 10 and components thereof (e.g., gas gauge IC chip 12) may perform processes related to managing an operating state of the battery 11.

Example Processes.

Figure 2:
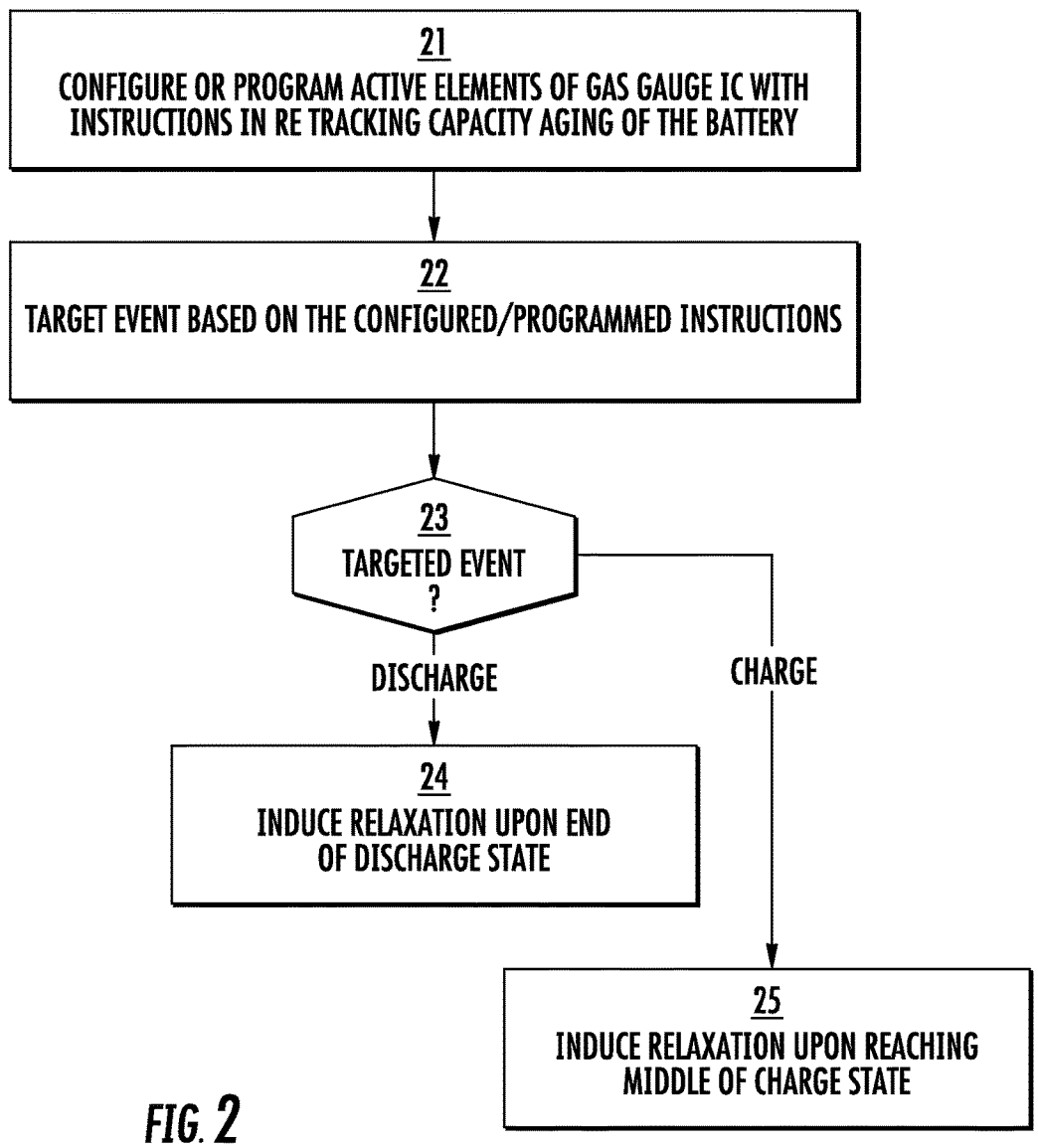
FIG. 2 depicts a flowchart for an example method for managing a mobile device battery operating state, according to an embodiment of the present invention.

FIG. 2 depicts a flowchart for an example method 20 for managing a mobile device battery operating state, according to an embodiment of the present invention. For example, the method 20 may comprise a process for managing the operating state of the battery 11.

In a step 21, active elements of the gas gauge IC component 12 are configured and/or programmed based on instructions, which relate to tracking capacity aging of the battery 11.

In a step 22, an event is targeted based on the configured or programmed instructions. The targeted event may correspond to reaching an end of a discharge state of the battery 11, or to reaching a midpoint (e.g., 30%-50% relative to a full charge) of a charging state of the battery 11.

In a step 23, it is determined whether the targeted event corresponds to the reaching an end of the discharge state of the battery 11, or to the reaching the midpoint of the charging state of the battery 11. A relaxation state is induced in the battery 11 upon the targeted event occurring.

If it is determined that the targeted event corresponds to the reaching the end of its discharge state, then the relaxation state is induced in a step 24 upon the battery 11 reaching the end of the discharge.

If it is determined that the targeted event corresponds to the reaching the end of its discharge state, then the relaxation state is induced in a step 25 upon the battery 11 reaching the middle (relative to its full charge) of the charge state.

In an example embodiment, the configuring and/or programming the one or more of the portion of active elements comprises setting a value corresponding to one or more of the full battery charge, or the battery charging state midpoint. The targeted event may occur with the mobile device 700 coupled to the docking station 195. In an example embodiment, the induced relaxation state may be sustained.

Figure 3:
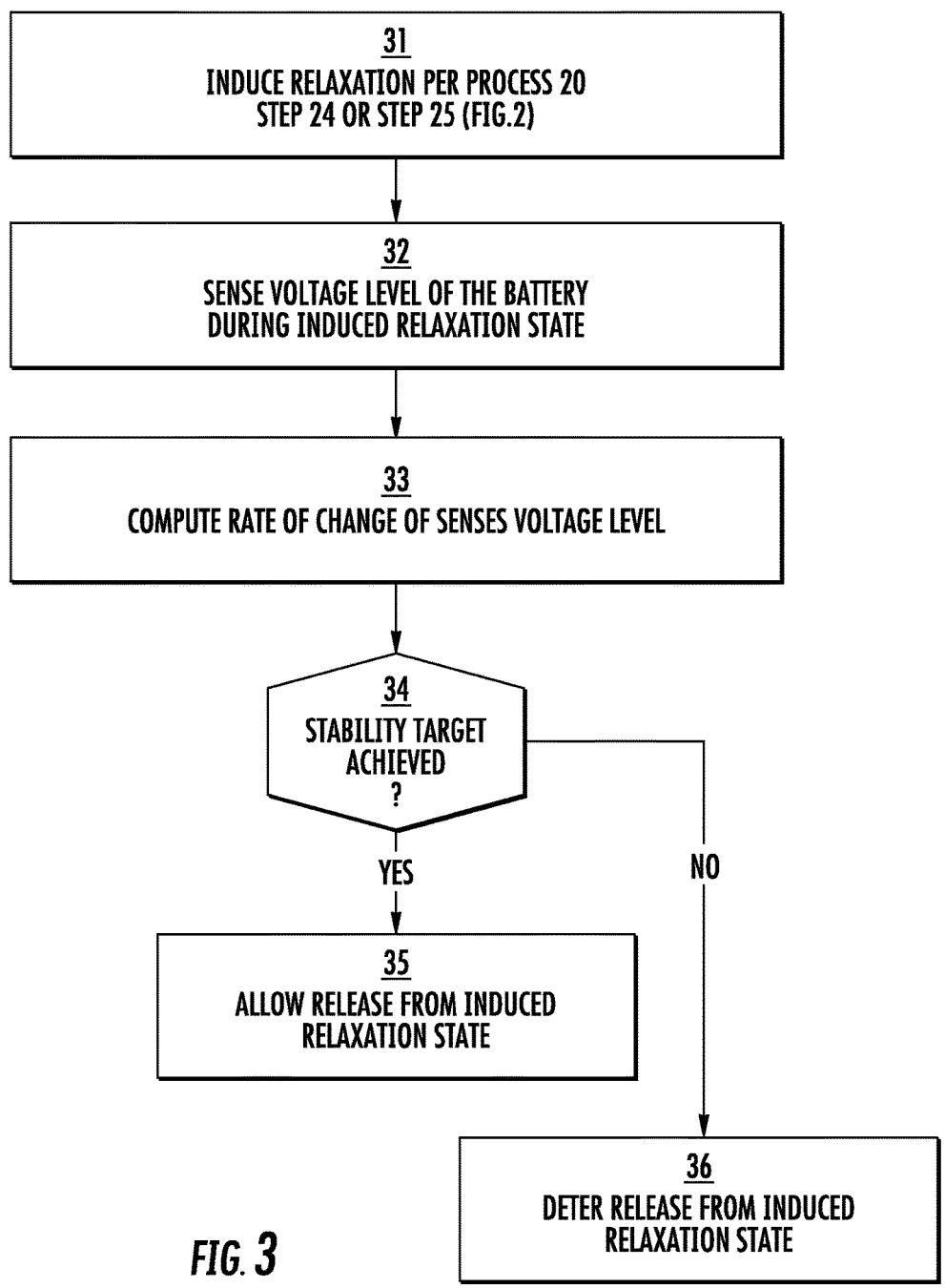
FIG. 3 depicts a flowchart for an example method for managing induced battery relaxation states, according to an embodiment of the present invention.

FIG. 3 depicts a flowchart for an example method 30 for managing induced battery relaxation states, according to an embodiment of the present invention.

In a step 31, a relaxation state is induced in the battery 11 per the process 20, step 24, or step 25 (FIG. 2).

In a step 32, a voltage level of the battery 11 is sensed during the induced relaxation state.

In a step 33, a rate of change of the sensed voltage level may be computed.

In a step 34, a determination is made as to whether a stability target is reached in relation to the sensed voltage level may be computed.

A release of the battery from the induced relaxation state may be deterred unless and/or until the computed rate of change of the sensed voltage level meets a stability target.

The stability target may relate to a maximum allowable rate of the voltage level change. For example, an embodiment may be implemented in which the stability target corresponds to a maximum allowable voltage level change rate of 1 µV/sec.

If it is determined that the stability target has been achieved, then in a step 35, a release of the battery 11 is allowed.

If it is determined that the stability target has not been achieved, then in a step 36, a release of the battery 11 is deterred.

Figure 4:
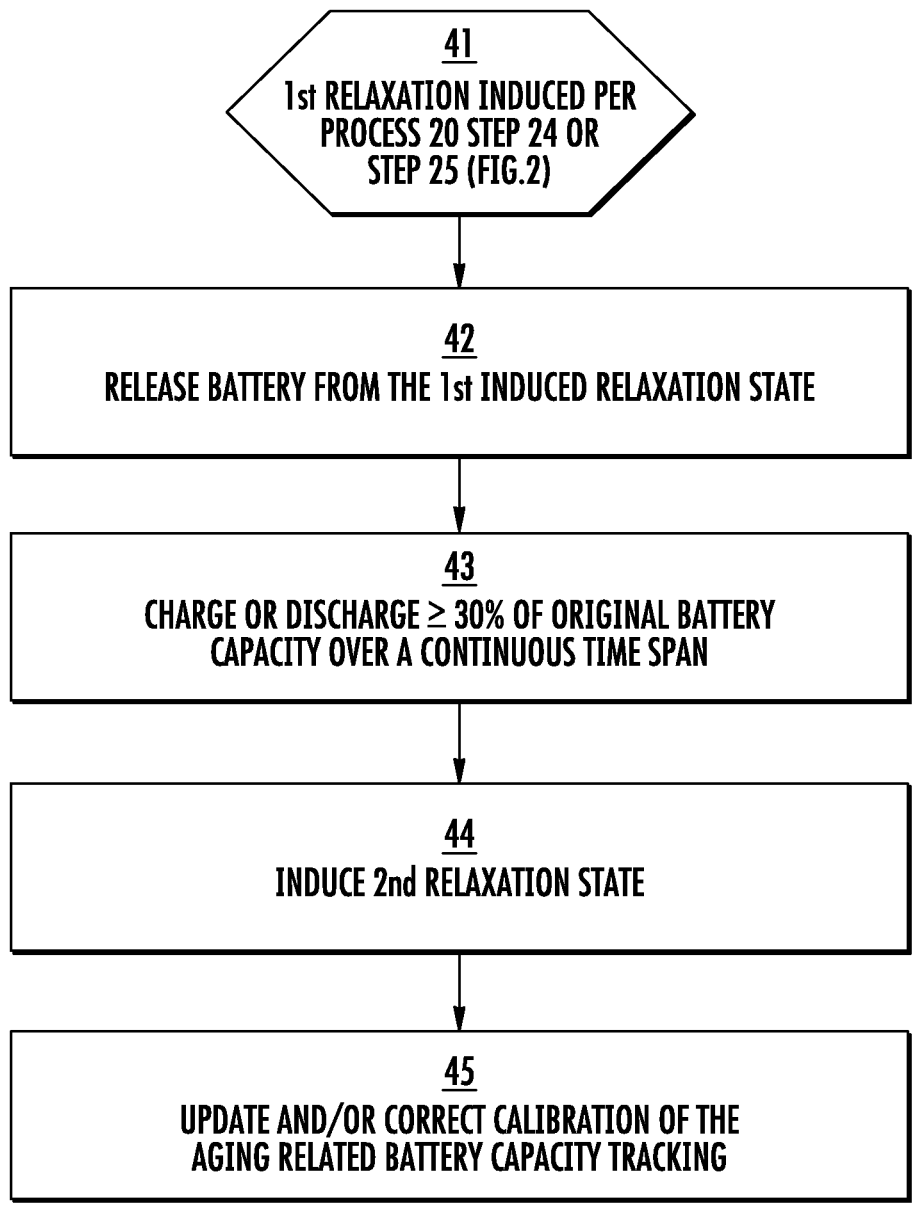
FIG. 4 depicts a flowchart for an example method for calibrating aging related battery capacity tracking, according to an embodiment of the present invention.

FIG. 4 depicts a flowchart for an example method 40 for calibrating aging related battery capacity tracking, according to an embodiment of the present invention. The induced relaxation state may comprise a first induced relaxation state of multiple relaxation states.

In a step 41 for example, the first induced relaxation state is induced per the step 24 or the step 25 of the process 20 (FIG. 2).

In a step 42, the battery 11 is released from the first induced relaxation state.

Upon releasing the battery from the first induced relaxation state, the battery may be, selectively, charged or discharged in a step 43. The battery 11 is charged or discharged to a capacity value of at least 30 percent of an original capacity thereof over a continuous time span.

In a step 44, a second relaxation state is induced in the battery 11.

In a step 45, the aging related tracking is calibrated, in relation to an update and/or a correction.

During the induced relaxation states, the battery voltage level may be validated as comprising a value between, approximately, a fifth (20%) of a full charge battery voltage level and a half (50%) of the full charge battery voltage level, inclusive. The calibration of the battery capacity aging may be performed upon completing the validating step.

An example embodiment may be implemented, in which the targeted event further comprises, optionally, an end of a charge state of the battery.

Figure 5:
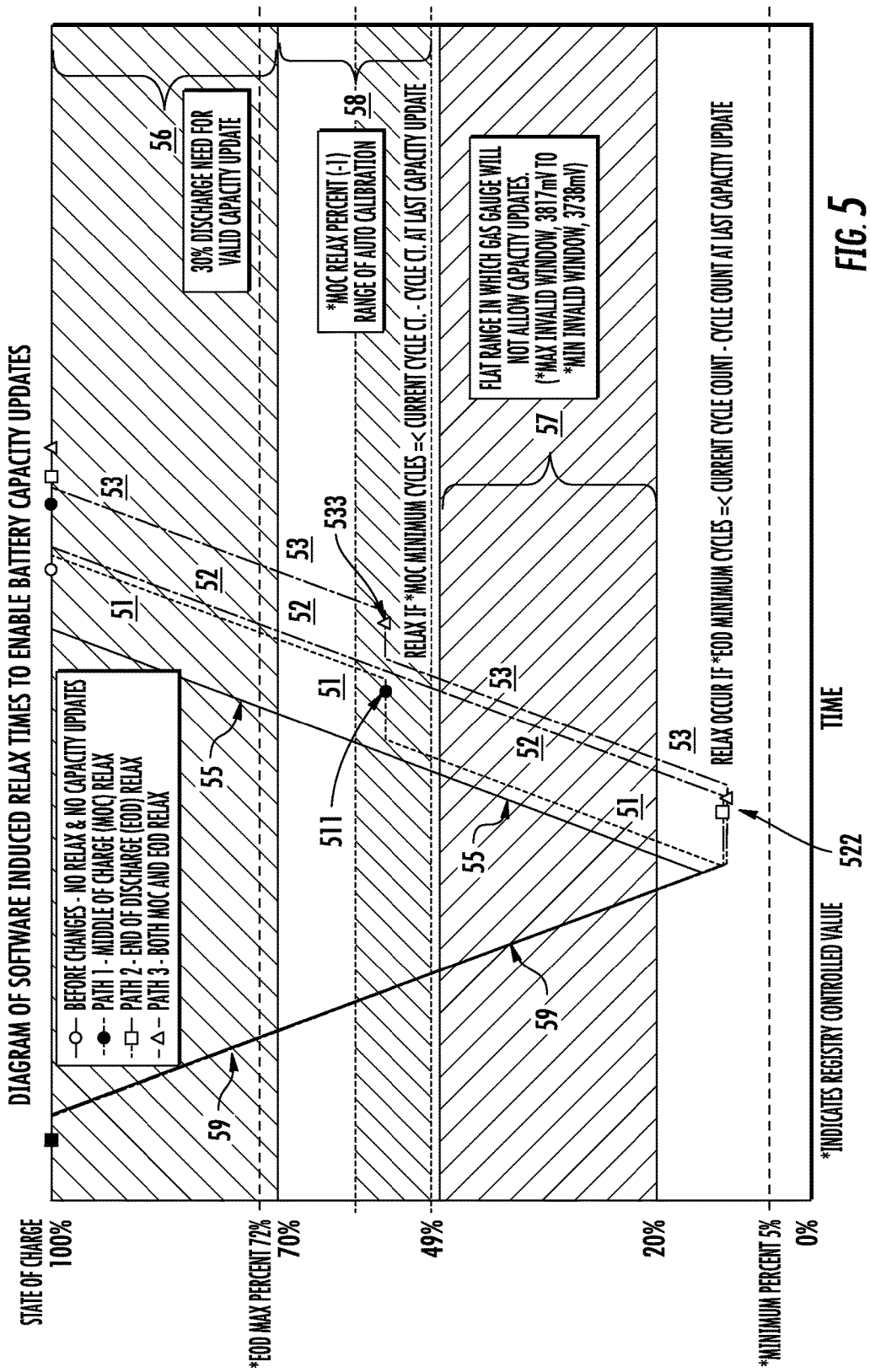
FIG. 5 depicts a diagram of example battery charge states, according to an embodiment of the present invention

FIG. 5 depicts a diagram of example battery charge states 50, according to an embodiment of the present invention. A pathway 59 represents a track of a discharge of the battery 11 over a range of percentage of a full (100%) charge (vertical 'y' axis) as a function of time (horizontal 'x' axis). A pathway 55 tracks a corresponding charge of the battery 11 as a pathway, which may reflect the discharge pathway 59 in a complimentary aspect.

A pathway 51 tracks a charge of the battery 11, according to a first implementation of an example embodiment of the present invention. The pathway 51 depicts a relaxation state induced at a midpoint 511 (relative to 100% charge) in the charge pathway 51.

A pathway 52 tracks a charge of the battery 11, according to a second implementation of an example embodiment of the present invention. The pathway 52 depicts a relaxation state induced at an end 522 of the discharge, represented by the pathway 59.

A pathway 53 tracks a charge of the battery 11, according to a third implementation of an example embodiment of the present invention. The pathway 53 depicts a first relaxation state induced at the end 522 of the discharge, represented by the pathway 59. The pathway 53 also depicts a second relaxation state induced at a midpoint 533 (relative to 100% charge) in the charge pathway 53.

A band 56 corresponds to a 30% discharge, which is used for making valid updates and/or corrections for calibrating the age related capacity tracking of the battery 11. A band 57 corresponds to a flat range in which the gas gauge 12 may inhibit updates or corrections for calibrating the age related capacity tracking of the battery 11. A band 58 corresponds to a range for calibrating the age related capacity tracking of the battery 11, following the middle-of-the-charge relaxation induced according to the track 51 and/or the track 53. Values for a minimum allowable charge percentage and/or an end-of-discharge maximum charge percentage may be controlled according to values set in a registry of the gas gauge chip 12.

Example IC Device.

Figure 6:
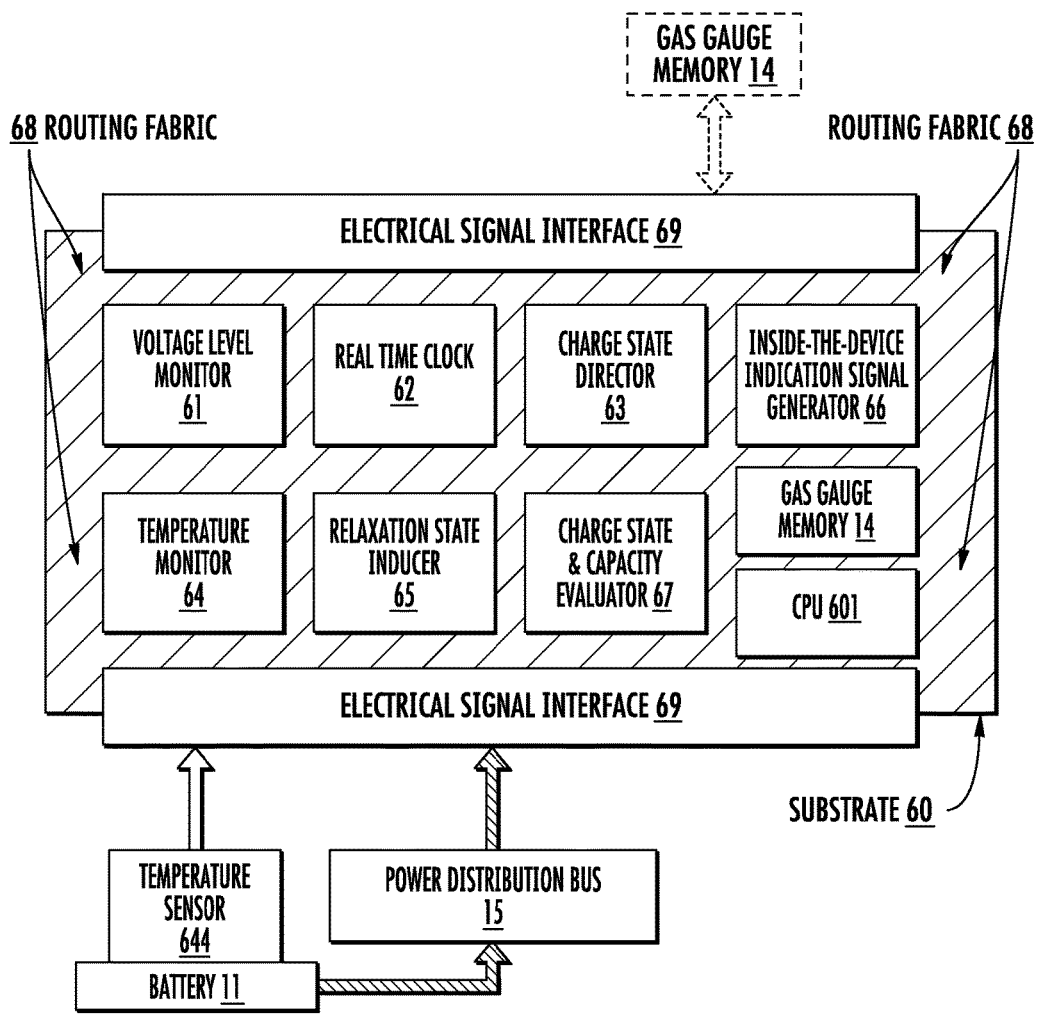
FIG. 6 depicts an example gas gauge IC chip, according to an embodiment of the present invention.

FIG. 6 depicts an example gas gauge IC chip 12, according to an embodiment of the present invention. The gas gauge IC 12 may comprise a microprocessor, microcontroller, PLD, FPGA, ASIC and/or power management-related component of the mobile device 700.

The gas gauge chip 12 comprises a substrate 60 of silicon or another semiconductor material, which may be fabricated according to various processes. An example embodiment may be implemented in which the gas gauge 12 comprises a plurality of active elements, such as transistors, memory cells, and other non-transitory computer readable storage media. The active elements and memory cells are disposed over the substrate 60, in which they are fabricated.

The gas gauge chip 12 also comprises a routing fabric 68 disposed over the semiconductor substrate 60. The routing fabric 68 comprises a matrix of conductive horizontal traces and conductive vertical interconnection accesses (vias), such as a through-silicon via (TSV). The conductive matrix may comprise metals (e.g., copper, silver, aluminum, gold, alloys) and other electrical conductors, insulated by dielectric materials, such as oxides, nitrides, and other compounds, which may be fabricated with the semiconductor material. The routing fabric is operable for interconnecting the active elements of the gas gauge 12 for exchange of data signals between each other and for sensing and receiving electrical power from the battery 11.

At least a portion of the active elements of the gas gauge IC component 12 are configured/programmed based on instructions, which relate to tracking the capacity aging of the battery 11. An event is targeted based on the configured or programmed instructions. In example embodiments of the present invention, the targeted event corresponds to reaching an end of a discharge state of the battery 11, or to reaching a midpoint (relative to a full charge) of a charging state of the battery 11. A relaxation state is induced in the battery 11 upon the targeted event occurring.

An embodiment of the present invention thus tracks aging of the capacity of the battery 11 and induces relaxation states in the battery 11 consistently and reliably, which allows accurate calibration and/or updating of the tracking of the capacity aging tracking. The gas gauge IC chip 12 is further operable for providing an awareness of age related condition changes in the battery 11, such as the capacity, as an inside-the-device power indication 145 to one or more of the multiple electronic components 110 of the mobile device 700.

An example embodiment may be implemented, in which the at least portion of the active elements of the gas gauge 12 comprise components of existing gas gauge ICs, which exist originally in an unused, undocumented or "hidden" legacy ("unused") status. The unused active elements are then configured/programmed based on the instructions for tracking the capacity aging of the battery 11, in which the relaxation states are induced in the battery 11 at the end of its discharge state and/or in the middle (relative to the full charge) of its charge state.

The gas gauge chip 12 may also comprise an ASIC or other IC device fabricated specifically with at least a portion of its active elements configured/programmed with the instructions for tracking the capacity aging of the battery 11. The capacity aging tracking instructions relate to inducing the relaxation states in the battery 11 at the end of its discharge state and/or in the middle (relative to the full charge) of its charge state.

The gas gauge chip 12 may read data from, and write data to, a non-transitory computer readable storage medium such as a gas gauge memory 14. Example embodiments may be implemented in which the gas gauge memory 14 comprises non-transitory storage media external to the gas gauge IC chip 12 and/or internal thereto, such as at least a portion of its internal memory cells. External non-transitory storage media 14 may exchange data signals (e.g., reads, writes, etc.) with the gas gauge 12 via an electrical and signal interface 69.

The electrical and signal interface 69 comprises a conductive pathway, electrically coupled to the routing fabric 68, and operable for allowing an exchange data signals with components of the mobile device 700, which are external to the gas gauge chip 12. The gas gauge 12 senses the electrical parameters of the battery 11 and receives power therefrom through the electrical and signal interface, via the power distribution bus 15.

A temperature sensor 644 is operable for sensing a temperature of the battery 11 and providing a corresponding temperature indication signal to the gas gauge 12 via the electrical and signal interface 69. Other physical parameters sensed in relation to the battery 11 may also be sent to the gas gauge 12, via the electrical and signal interface 69.

The active elements of the gas gauge 12 may comprise a gas gauge central processing unit (CPU) 601, which is operable for reading data from, and writing data to, the gas gauge memory 14 and for exchanging data signals with other active elements of the gas gauge 12. An example embodiment may be implemented in which the gas gauge CPU 601 is also operable for controlling, at least in part, the configured/programmed active elements in relation to executing the instructions for the tracking of the capacity aging of the battery 11. The instructions for the tracking of the battery 11 capacity aging may configure/program each of the at least portion of the active elements for performing specific related operations.

One or more of the active elements may be configured/programmed as a voltage level monitor 61. The voltage level monitor 61 is operable for sensing the voltage level of the battery 11.

One or more of the portion of the active elements may be configured/programmed as a real time clock 62, operable for tracking the passage of time and generating a corresponding clock signal. The clock signal is operable for synchronizing operations of other active elements of the at least portion, and clocking signal interchanges between them. While sensing the voltage level of the battery 11 for example, the voltage monitor 61 is also operable based on the clock signal for determining a time rate of change of the monitored voltage level and whether related stability targets are achieved.

One or more of the portion of the active elements may be configured/programmed as a charge state director 63. The charge state director 63 is operable with (or in lieu of) the charge state controller 155, for directing whether a charge state or a discharge state characterizes the battery 11 at a given point in time.

One or more of the portion of the active elements may be configured/programmed as an evaluator 67, operable in relation to the charge state of the battery 11 relative to its full capacity.

One or more of the active elements may be configured/programmed as a relaxation state inducer 65. The relaxation state inducer 65 is operable for inducing the relaxation state in the battery 11, based on an embodiment of the present invention, at the end of a discharge state or in the middle (relative to full charge) of a charge state. The relaxation state inducer 65 is operable with the charge state director 63, the charge state and capacity evaluator 67, and (or in lieu of) the charge state controller 155, for the inducement of the relaxation state.

The gas gauge chip 12 and the configured/programmed portion of its active elements are thus operable for performing process 20, 30 and 40, inclusive (FIGS. 2, 3 and 4, respectively). The tracking the capacity aging of the battery 11 is calibrated and corrected upon the induced battery relaxations. While tracking the capacity aging of the battery 11, computations performed based on the configured/programmed instructions by the voltage monitor 61 and the charge state and capacity evaluator 67 may indicate an approach of the battery 11 to an end of its useful lifetime.

One or more of the portion of the active elements may be configured/programmed as a signal generator 66, which is operable for generating an indication signal for use within the mobile device 700. The inside-the-device indication signal is provided to the electronic components 110 for use within the mobile device 700 in relation to realizing the approach of its battery 11 to an end of useful lifetime.

Components of the gas gauge chip 12, including the voltage level monitor 61, the real time clock 62, the charge state and capacity evaluator 67, and the indication signal generator 66, inclusive, may be operable together for computing and reporting a remaining battery capacity value (e.g., in mAh units) and a remaining battery run-time value, in relation to providing adequate power to energize full operability of the mobile device 700 (e.g., in min.).

Example Mobile Device.

Figure 7:
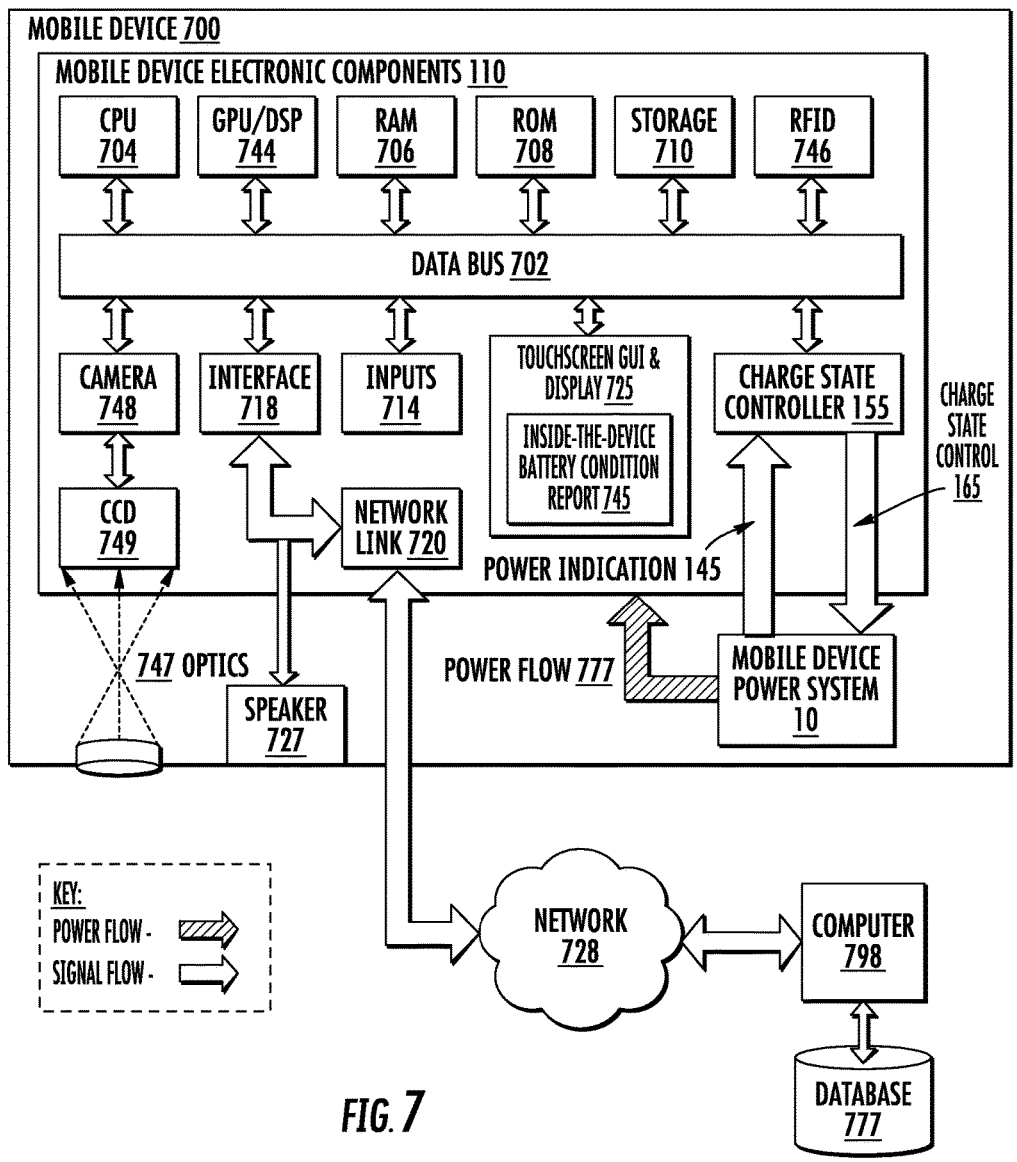
FIG. 7 depicts an example mobile device, according to an embodiment of the present invention.

FIG. 7 depicts an example mobile device 700, according to an embodiment of the present invention. The mobile device 700 may comprise a PDT, a smartphone, a tablet computer, a PDA or another mobile or portable computing apparatus.

The mobile device 700 comprises the plurality of electronic components 110. Each of the multiple electronic components 110 is coupled to a data bus 702, which is operable for conducting data signals exchanged with one or more of the other electronic components 110.

The mobile device 700 comprises the power system 10. The power system 10 is energized by the battery 11 and is operable for providing electrical power therefrom to the electronic components 110 of the mobile device 700. The battery 11 energizes the power system 10 with DC electrical power within the given, specified range of voltage. The power system 10 comprises the gas gauge chip 12, described above.

The gas gauge chip 12 may comprise a microprocessor, microcontroller, FPGA or other PLD, or ASIC and is operable for monitoring a condition of the battery 11, based on voltage level, rate of change of the voltage level, and other electrical and physical (e.g., temperature) parameters.

The battery 11 has a discharge state, in which the battery 11 is operable for energizing the power system 11 with DC current flow drawn therefrom and supplied as electrical power to the electronic components 110 of the mobile device 700. The battery 11 also has a charge state, in which the battery 11 is operable for drawing electrical current from a charger such as the docking station 195 (FIG. 1). The monitored electrical (and other parameters) change in real time and over the duration of extended time periods. The parameters change based on the various operating states of the battery 11.

The capacity of the battery 11 relates to its capability for operably driving a rated amount of current drawn by the mobile device components 110, within the specified voltage range, over the duration of the specified time period.

For example, operations performed by the various electronic components 110 in performing various features and functions of the mobile device. Such design basis operations are supported by an adequate capacity of the battery 11. The capacity may change over time as the battery 11 ages. The battery capacity thus degrades over time due to electrical, physical, and/or electrochemical changes within the battery 11.

For example, some electrochemical reactions are inherent to operations of the battery 11 as a power source to the mobile device 700. Oxidation and corrosion (and/or other electrochemical reactions) affect electrical and physical characteristics of plates, contacts, electrodes and other components of the battery 11 over its operating time.

The electrochemical effects raise the operating temperature, and cause/contribute to other physical effects, as the battery 11 maintains given electrical performance parameters in energizing the mobile device 700. The temperature increases raise the rates of the electrochemical reaction. The effects are cumulative and may establish or promote positive feedback, which accelerates the increased reaction rates and promotes downstream and/or dependent consequences. The accumulations of such effects over the operating lifetime of the battery 11 degrade its capacity as it ages.

Based at least in part on the real time monitoring of the voltage and other parameters of the battery 11, the gas gauge IC is operable over the useful lifetime of the battery 11 for tracking its capacity aging.

The battery 11 also has relaxation states, during which the battery 11 provides or draws no current. During a relaxation, 0 mA flows from or to the battery 11. The relaxation state of the battery 11 is associated with suspended operations of the mobile device 700, during which it rests in the docking station 195. In example embodiments of the present invention, the gas gauge 12 monitors the electrical parameters of the battery 11 during its relaxation states, which comprise opportunities for calibrating and correcting its computations in relation to the tracking of the capacity aging of the battery 11.

The gas gauge 12 comprises the active elements described above, at least a portion of which are configured/programmed based on the instructions related to the tracking of the battery capacity aging, which target certain events. In example embodiments of the present invention, the targeted events correspond to reaching an end of a discharge state of the battery 11, and/or to reaching a midpoint (e.g., 30%-50% relative to the full charge) of the charging state of the battery 11. The relaxation states are induced in the battery 11 upon the targeted events occurring.

Example embodiments of the present invention thus track the aging of the capacity of the battery 11 and induce relaxation states therein consistently and reliably. The relaxations allow accurate calibration, including updates and corrections, of the tracking of the battery 11 capacity aging tracking. The gas gauge is also operable for providing the inside-the-device power indication 145 to the multiple electronic components 110 of the mobile device 700. One or more of the electronic devices 110 may process data relating to the power indication 145. A display component 725 of the mobile device 700 renders a condition report 745 corresponding to the power indication 145.

The mobile device 700 is operable for communicating with other devices, such as a computer 798. The mobile device 700 is coupled communicatively via the network 728 with the computer 798. The network 728 may comprise a packet-switched data network operable based on transfer control and internetworking protocols, such as TCP/IP.

For example, the network 728 may comprise a digital telephone network. The network 728 may comprise a portion of one or more other networks and/or two or more sub-network ("subnet") components. For example, the network 728 may comprise a portion of the internet and/or a particular wide area network (WAN). The network 728 may also comprise one or more WAN and/or local area network (LAN) subnet components. Portions of the network 728 may be operable wirelessly and/or with wireline related means.

The computer 798 may comprise another mobile device. The computer 798 may also comprise a computer operable at a particular location, where it may be disposed in a more or less fixed or at least stationary position or configuration. In relation to the mobile device 700, the computer 798 may also be operable as a server and/or for performing one or more functions relating to control or centralized pooling, processing or storage of information gathered or accessed therewith.

For example, embodiments of the present invention may be implemented in which the mobile device 700 is operable for sending the rendered battery condition report 745 (and/or data relating to the power indication 145) to the computer 798 over the network 728.

The mobile device 700 may also be operable for capturing images photographically (including recording video) and/or scanning and reading barcode patterns and other data presented by graphic media and/or radio frequency identification (RFID) tags. The images and data associated with the barcode and/or RFID tags may be sent to the computer 798. The mobile device 700 may thus be used for scanning barcodes and RFIDs and for reading data (e.g., inventory information, price, etc.) therefrom in relation to an associated item (e.g., part, component, stock, product, commodity, etc.).

The mobile device 700 may then send the battery condition report 745, data relating to the power indication 145, and/or the scan related data to the computer 798 over the network 728 scan related data wirelessly, via the network 728, to the computer 798. Upon receipt thereof, the computer 798 may be operable for processing the data related to the battery condition report 745, the power indication 145, and the scan related data. The scan data may relate to a sale, transfer or other disposition of the item associated with the barcode or RFID tag. The processing of the data may thus allow, for example, updating a database 777 (e.g., inventory) in relation to the battery condition report 745, the power indication 145, and the item associated with the scanned barcode or RFID tag.

An example embodiment is implemented in which the mobile device 700 comprises a data bus 702 and various other components, which are described below. The data bus 702 is operable for allowing each of the various electronic components 110 to exchange data signals with each of the other electronic components.

The electronic components 110 comprise at least one CPU 704 of the mobile device 700. The CPU 704 may comprise a microprocessor device. The CPU 704 is operable for performing general data processing functions related to operations of the mobile device 700.

The electronic components 110 may also comprise one or more other processors 744. The one or more processors 744 may be operable as a "math" (mathematics) coprocessor, a digital signal processor (DSP) or a graphics processing unit (GPU). The one or more GPUs, DSPs and/or math coprocessors ("GPU/DSP") 744 are operable for computing processing functions that may be somewhat specialized relative to the more generalized processing operations that may be performed, e.g. by the CPU 704.

The DSP/GPU 744 may be operable for performing computationally intense data processing in relation to graphics, images and other (e.g., mathematical, financial) information. The GPU/DSP 744 may also share data processing functions with the CPU 704. Data processing operations comprise computations performed electronically by the CPU 704 and the DSP/GPU 744.

For example, the microprocessors may comprise components operable as an arithmetic logic unit (ALU), a floating point logic unit (FPU), and associated memory cells. The memory cells comprise non-transitory data storage media, which may be configured as caches (e.g., "L1," "L2"), registers, latches and/or buffers. The memory cells are operable for storing data electronically in relation to various functions of the processor. For example, a translational look-aside buffer (TLB) may be operable for optimizing efficiency of content-addressable memory (CAM) use by the CPU 704 and/or the DSP/GPU 744.

The mobile device 700 also comprises non-transitory computer readable storage media operable for storing data electronically. For example, the mobile device 700 comprises a main memory 706, such as a random access memory (RAM) or other dynamic storage device 706. The main memory 706 is coupled to data bus 702 for storing information and instructions, which are to be executed by the CPU 704. The main memory 706 also may be used for storing temporary variables or other intermediate information during execution of instructions by the CPU 704. Other memories (represented in the present description with reference to the RAM 706) may be installed for similar uses by the DSP/GPU 744.

The mobile device 700 further comprises a read-only memory (ROM) 708 or other static storage device coupled to the data bus 702. The ROM 708 is operable for storing static information and instructions for use by the CPU 704. In addition to the RAM 706 and the ROM 708, the non-transitory storage media of the mobile device 700 may comprise at least one data storage device 710. The data storage device 710 is operable for storing information and instructions and allowing access thereto.

The data storage device 710 may comprise a magnetic disk drive, flash drive, or optical disk drive. The data storage device 710 comprises non-transitory media coupled to data bus 702, and may be operable for providing a "virtual memory" function. The virtual memory operations of the storage device 710 may supplement, at least temporarily, storage capacity of other non-transitory media, such as the RAM 706.

Software and programming instructions, settings and configurations related to a suite of features may be stored magnetically, electronically or optically by the non-transitory storage medium 710. An example embodiment may be implemented in which a suite of features relates to applications, tools and tool sets, menus (and sub-menus) and macros associated with functions of the mobile device 700 related to scanning and reading barcode patterns and RFID tags, taking photographs, recording video information, and capturing other data related to images and presentations of graphic media and other information sources.

The mobile device 700 comprises the touchscreen GUI and display component 725. The touchscreen 725 comprises a liquid crystal display (LCD), which is operable for rendering images based on modulating variable polarization states of liquid crystal transistor devices. The touchscreen 725 also comprises an interface operable for receiving haptic inputs.

The haptic interface of the GUI touchscreen 725 may comprise, e.g., at least two arrays of microscopic (or transparent) conductors, each of which is insulated electrically from the other and disposed beneath a surface of the display 725 in a perpendicular orientation relative to the other. The haptic inputs comprise pressure applied to the surface of the touchscreen GUI 725, which cause corresponding local changes in electrical capacitance values proximate to the pressure application that are sensed by the conductor grids to effectuate a signal corresponding to the input.

In an example embodiment, the touchscreen GUI and display component 725 is operable for rendering graphically an inside-the-device report 745 in relation to a condition of the battery 11. The battery condition report 745 is rendered by the display 725 upon receipt of the inside-the-device indication 145 (FIG. 1) from the gas gauge chip 12.

The touchscreen GUI component 725 may be implemented operably for rendering images over a heightened (e.g., high) dynamic range (HDR), the rendering of the images may also be based on modulating a back-light unit (BLU). For example, the BLU may comprise an array of light emitting diodes (LEDs). The LCDs may be modulated according to a first signal and the BLU may be modulated according to a second signal. The touchscreen 725 may render an HDR image by coordinating the second modulation signal in real time, relative to the first modulation signal.

A plurality of inputs 714 may comprise one or more electromechanical switches, which may be implemented as buttons, escutcheons, or cursor controls. The inputs 714 may also comprise a keyboard. The keyboard may comprise an array of alphanumeric (and/or ideographic, syllabary based) keys operable for typing letters, number, and other symbols. The keyboard may also comprise an array of directional (e.g., "up/down," "left/right") keys, operable for communicating commands and data selections to the CPU 704 and for controlling movement of a cursor rendering over the touchscreen GUI display 725.

The directional keys may be operable for presenting two (2) degrees of freedom of a cursor, over at least two (2) perpendicularly disposed axes presented on the display component of the touchscreen GUI 725. A first 'x' axis is disposed horizontally. A second 'y' axis, complimentary to the first axis, is disposed vertically. Thus, the mobile device 700 is operable for specifying positions over a representation of a geometric plane.

The inputs 714 also comprise a microphone, operable for transducing speech and other sound into corresponding electrical signals that may be processed by one or more of the electronic components 110. Sound signals generated by at least one of the electronic components 110 may be transduced and rendered audibly by a speaker 727. At least one interface 718 may be operable for providing the sound signals to the speaker 727.

The mobile device 700 may be operable for scanning visual data such as barcode patterns and/or other images presented on printed graphic media and/or self-lit electronic displays. Example embodiments of the present invention also relate to the use of the mobile device 700 for taking photographs and recording video. A camera component 748 is coupled to the data bus 702. The camera component 748 is operable for receiving data related to the scanned barcode patterns.

The camera component 748 is also operable for receiving static and dynamic image data related, respectively, to the photographs and the video. The camera component 748 may receive the data captured from an image sensor 749. The image sensor 749 may comprise an array of charge-coupled devices (CCDs), photodiodes (PDs), or active complementary metal oxide semiconductor (CMOS) based imaging devices. The image sensor 749 may be operable with a system of optical components ("optics") 747. The barcode scanning (and other) feature(s) of the mobile device 700 may be operable with one or more of the camera component 748, the image sensor component 749, and/or the optics 747.

The electronic components 110 also comprise an RFID scanner 746 coupled to the data bus 702. The RFID scanner 746 is operable for scanning RFID tags.

Execution of instruction sequences contained in the main memory 706 causes the CPU 704 to perform process steps associated with operations of the mobile device 700. One or more processors in a multi-processing arrangement may also be employed to execute the sequences of instructions contained in main memory 706. Additionally and/or alternatively, hard-wired circuitry may be used in place of, or in combination with the software instructions. Thus, the mobile device 700 is not limited to any specific combination of circuitry, hardware, firmware, and/or software.

The term "computer readable storage medium," as used herein, may refer to any non-transitory storage medium that participates in providing instructions to the gas gauge 12 and the electronic components 110, including the CPU 704 (and the DSP/GPU 744) for execution. Such a medium may take many forms, including but not limited to, non-volatile media, volatile media, and transmission media. Non-volatile media comprises, for example, the configured/programmed active elements of the gas gauge 12 and optical or magnetic disks, such as storage device 710. Volatile media comprises dynamic memory, such as the gas gauge memory 14 and the RAM 706.

Transmission media comprises coaxial cables, copper wire and other electrical conductors and fiber optics, including the wires (and/or other conductors or optics) that comprise the data bus 702. Transmission media can also take the form of electromagnetic (e.g., light) waves, such as those generated during radio wave and infrared and other optical data communications (and acoustic, e.g., sound related, or other mechanical, vibrational, or phonon related transmission media).

Non-transitory computer-readable storage media may comprise, for example, flash drives such as may be accessible via USB (universal serial bus) or any medium from which a computer can read data.

Various forms of non-transitory computer readable storage media may be involved in carrying one or more sequences of one or more instructions to CPU 704 for execution. For example, the instructions may initially be carried on a magnetic or other disk of a remote computer (e.g., computer 798). The remote computer can load the instructions into its dynamic memory and send the instructions over networks 728.

The mobile device 700 can receive the data over the network 728 and use an infrared or other transmitter to convert the data to an infrared or other signal. An infrared or other detector coupled to the data bus 702 can receive the data carried in the infrared or other signal and place the data on data bus 702. The data bus 702 carries the data to main memory 706, from which CPU 704 retrieves and executes the instructions. The instructions received by main memory 706 may optionally be stored on storage device 710 either before or after execution by CPU 704.

The mobile device 700 also comprises at least a communication interface 718 coupled to the data bus 702. The communication interface 718 provides a two-way (or more) data communication coupling to a network link 720, which may connect to the network 728. In any implementation, the communication interface 718 sends and receives electrical, electromagnetic, or optical signals that carry digital data streams representing various types of information. The network link 720 provides data communication through the network 728 to other data devices. The communication interface 718 may also provide audio signals to the speaker 727.

The network 728 may use one or more of electrical, electromagnetic, and/or optical signals carrying digital data streams. The signals sent over the network 728 and through the network link 720 and communication interface 718 carry the digital data to and from the mobile device 700. The mobile device 700 can send messages and receive data, including program code, through the network 728, network link 720, and communication interface 718.

Example embodiments of the present invention are thus described. Example embodiments relate to a method for managing a mobile device battery operating state. Embodiments also relate to an example power system for a mobile device, an example gas gauge IC chip for mobile devices, and an example mobile device.

\* \* \*

In the specification and/or figures of the present Application, embodiments of the invention have been described in relation to an example method for managing a mobile device battery operating state. Active elements of the gas gauge IC component of the mobile device are configured and/or programmed based on instructions, which relate to tracking capacity aging of the battery. An event is targeted based on the configured or programmed instructions. The targeted event corresponds to reaching an end of a discharge state of the battery, or to reaching a midpoint (relative to a full charge) of a charging state of the battery. A relaxation state is induced in the battery upon the targeted event occurring.

\* \* \*

To supplement the specification of the present disclosure, the present application incorporates by reference, in their entirety, the following commonly assigned patents, patent application publications, and patent applications: U.S. Pat. Nos. 6,832,725; 7,128,266; 7,159,783; 7,413,127; 7,726,575; 8,294,969; 8,317,105; 8,322,622; 8,366,005; 8,371,507; 8,376,233; 8,381,979; 8,390,909; 8,408,464; 8,408,468; 8,408,469; 8,424,768; 8,448,863; 8,457,013; 8,459,557; 8,469,272; 8,474,712; 8,479,992; 8,490,877; 8,517,271; 8,523,076; 8,528,818; 8,544,737; 8,548,242; 8,548,420; 8,550,335; 8,550,354; 8,550,357; 8,556,174; 8,556,176; 8,556,177; 8,559,767; 8,599,957; 8,561,895; 8,561,903; 8,561,905; 8,565,107; 8,571,307; 8,579,200; 8,583,924; 8,584,945; 8,587,595; 8,587,697; 8,588,869; 8,590,789; 8,596,539; 8,596,542; 8,596,543; 8,599,271; 8,599,957; 8,600,158; 8,600,167; 8,602,309; 8,608,053; 8,608,071; 8,611,309; 8,615,487; 8,616,454; 8,621,123; 8,622,303; 8,628,013; 8,628,015; 8,628,016; 8,629,926; 8,630,491; 8,635,309; 8,636,200; 8,636,212; 8,636,215; 8,636,224; 8,638,806; 8,640,958; 8,640,960; 8,643,717; 8,646,692; 8,646,694; 8,657,200; 8,659,397; 8,668,149; 8,678,285; 8,678,286; 8,682,077; 8,687,282; 8,692,927; 8,695,880; 8,698,949; 8,717,494; 8,717,494; 8,720,783; 8,723,804; 8,723,904; 8,727,223; D702,237; 8,740,082; 8,740,085; 8,746,563; 8,750,445; 8,752,766; 8,756,059; 8,757,495; 8,760,563; 8,763,909; 8,777,108; 8,777,109; 8,779,898; 8,781,520; 8,783,573; 8,789,757; 8,789,758; 8,789,759; 8,794,520; 8,794,522; 8,794,526; 8,798,367; 8,807,431; 8,807,432; 8,820,630; International Publication No. 2013/163789; International Publication No. 2013/173985; International Publication No. 2014/019130; International Publication No. 2014/110495; U.S. Patent Application Publication No. 2008/185432; U.S. Patent Application Publication No. 2009/0134221; U.S. Patent Application Publication No. 2010/0177080; U.S. Patent Application Publication No. 2010/0177076; U.S. Patent Application Publication No. 2010/0177707; U.S. Patent Application Publication No. 2010/0177749; U.S. Patent Application Publication No. 2011/0202554; U.S. Patent Application Publication No. 2012/0111946; U.S. Patent Application Publication No. 2012/0138685; U.S. Patent Application Publication No. 2012/0168511; U.S. Patent Application Publication No. 2012/0168512; U.S. Patent Application Publication No. 2012/0193423; U.S. Patent Application Publication No. 2012/0203647; U.S. Patent Application Publication No. 2012/0223141; U.S. Patent Application Publication No. 2012/0228382; U.S. Patent Application Publication No. 2012/0248188; U.S. Patent Application Publication No. 2013/0043312; U.S. Patent Application Publication No. 2013/0056285; U.S. Patent Application Publication No. 2013/0070322; U.S. Patent Application Publication No. 2013/0075168; U.S. Patent Application Publication No. 2013/0082104; U.S. Patent Application Publication No. 2013/0175341; U.S. Patent Application Publication No. 2013/0175343; U.S. Patent Application Publication No. 2013/0200158; U.S. Patent Application Publication No. 2013/0256418; U.S. Patent Application Publication No. 2013/0257744; U.S. Patent Application Publication No. 2013/0257759; U.S. Patent Application Publication No. 2013/0270346; U.S. Patent Application Publication No. 2013/0278425; U.S. Patent Application Publication No. 2013/0287258; U.S. Patent Application Publication No. 2013/0292475; U.S. Patent Application Publication No. 2013/0292477; U.S. Patent Application Publication No. 2013/0293539; U.S. Patent Application Publication No. 2013/0293540; U.S. Patent Application Publication No. 2013/0306728; U.S. Patent Application Publication No. 2013/0306730; U.S. Patent Application Publication No. 2013/0306731; U.S. Patent Application Publication No. 2013/0307964; U.S. Patent Application Publication No. 2013/0308625; U.S. Patent Application Publication No. 2013/0313324; U.S. Patent Application Publication No. 2013/0313325; U.S. Patent Application Publication No. 2013/0341399; U.S. Patent Application Publication No. 2013/0342717; U.S. Patent Application Publication No. 2014/0001267; U.S. Patent Application Publication No. 2014/0002828; U.S. Patent Application Publication No. 2014/0008430; U.S. Patent Application Publication No. 2014/0008439; U.S. Patent Application Publication No. 2014/0025584; U.S. Patent Application Publication No. 2014/0027518; U.S. Patent Application Publication No. 2014/0034734; U.S. Patent Application Publication No. 2014/0036848; U.S. Patent Application Publication No. 2014/0039693; U.S. Patent Application Publication No. 2014/0042814; U.S. Patent Application Publication No. 2014/0049120; U.S. Patent Application Publication No. 2014/0049635; U.S. Patent Application Publication No. 2014/0061305; U.S. Patent Application Publication No. 2014/0061306; U.S. Patent Application Publication No. 2014/0063289; U.S. Patent Application Publication No. 2014/0066136; U.S. Patent Application Publication No. 2014/0067692; U.S. Patent Application Publication No. 2014/0070005; U.S. Patent Application Publication No. 2014/0071840; U.S. Patent Application Publication No. 2014/0074746; U.S. Patent Application Publication No. 2014/0075846; U.S. Patent Application Publication No. 2014/0076974; U.S. Patent Application Publication No. 2014/0078341; U.S. Patent Application Publication No. 2014/0078342; U.S. Patent Application Publication No. 2014/0078345; U.S. Patent Application Publication No. 2014/0084068; U.S. Patent Application Publication No. 2014/0097249; U.S. Patent Application Publication No. 2014/0098792; U.S. Patent Application Publication No. 2014/0100774; U.S. Patent Application Publication No. 2014/0100813; U.S. Patent Application Publication No. 2014/0103115; U.S. Patent Application Publication No. 2014/0104413; U.S. Patent Application Publication No. 2014/0104414; U.S. Patent Application Publication No. 2014/0104416; U.S. Patent Application Publication No. 2014/0104451; U.S. Patent Application Publication No. 2014/0106594; U.S. Patent Application Publication No. 2014/0106725; U.S. Patent Application Publication No. 2014/0108010; U.S. Patent Application Publication No. 2014/0108402; U.S. Patent Application Publication No.

2014/0108682; U.S. Patent Application Publication No. 2014/0110485; U.S. Patent Application Publication No. 2014/0114530; U.S. Patent Application Publication No. 2014/0124577; U.S. Patent Application Publication No. 2014/0124579; U.S. Patent Application Publication No. 2014/0125842; U.S. Patent Application Publication No. 2014/0125853; U.S. Patent Application Publication No. 2014/0125999; U.S. Patent Application Publication No. 2014/0129378; U.S. Patent Application Publication No. 2014/0131438; U.S. Patent Application Publication No. 2014/0131441; U.S. Patent Application Publication No. 2014/0131443; U.S. Patent Application Publication No. 2014/0131444; U.S. Patent Application Publication No. 2014/0131445; U.S. Patent Application Publication No. 2014/0131448; U.S. Patent Application Publication No. 2014/0133379; U.S. Patent Application Publication No. 2014/0136208; U.S. Patent Application Publication No. 2014/0140585; U.S. Patent Application Publication No. 2014/0151453; U.S. Patent Application Publication No. 2014/0152882; U.S. Patent Application Publication No. 2014/0158770; U.S. Patent Application Publication No. 2014/0159869; U.S. Patent Application Publication No. 2014/0160329; U.S. Patent Application Publication No. 2014/0166755; U.S. Patent Application Publication No. 2014/0166757; U.S. Patent Application Publication No. 2014/0166759; U.S. Patent Application Publication No. 2014/0166760; U.S. Patent Application Publication No. 2014/0166761; U.S. Patent Application Publication No. 2014/0168787; U.S. Patent Application Publication No. 2014/0175165; U.S. Patent Application Publication No. 2014/0175169; U.S. Patent Application Publication No. 2014/0175172; U.S. Patent Application Publication No. 2014/0175174; U.S. Patent Application Publication No. 2014/0191644; U.S. Patent Application Publication No. 2014/0191913; U.S. Patent Application Publication No. 2014/0197238; U.S. Patent Application Publication No. 2014/0197239; U.S. Patent Application Publication No. 2014/0197304; U.S. Patent Application Publication No. 2014/0203087; U.S. Patent Application Publication No. 2014/0204268; U.S. Patent Application Publication No. 2014/0214631; U.S. Patent Application Publication No. 2014/0217166; U.S. Patent Application Publication No. 2014/0217180;

U.S. patent application Ser. No. 13/367,978 for a Laser Scanning Module Employing an Elastomeric U-Hinge Based Laser Scanning Assembly, filed Feb. 7, 2012 (Feng et al.);

U.S. patent application Ser. No. 29/436,337 for an Electronic Device, filed Nov. 5, 2012 (Fitch et al.);

U.S. patent application Ser. No. 13/771,508 for an Optical Redirection Adapter, filed Feb. 20, 2013 (Anderson);

U.S. patent application Ser. No. 13/852,097 for a System and Method for Capturing and Preserving Vehicle Event Data, filed Mar. 28, 2013 (Barker et al.);

U.S. patent application Ser. No. 13/902,110 for a System and Method for Display of Information Using a Vehicle-Mount Computer, filed May 24, 2013 (Hollifield);

U.S. patent application Ser. No. 13/902,144, for a System and Method for Display of Information Using a Vehicle-Mount Computer, filed May 24, 2013 (Chamberlin);

U.S. patent application Ser. No. 13/902,242 for a System For Providing A Continuous Communication Link With A Symbol Reading Device, filed May 24, 2013 (Smith et al.);

U.S. patent application Ser. No. 13/912,262 for a Method of Error Correction for 3D Imaging Device, filed Jun. 7, 2013 (Jovanovski et al.);

U.S. patent application Ser. No. 13/912,702 for a System and Method for Reading Code Symbols at Long Range Using Source Power Control, filed Jun. 7, 2013 (Xian et al.);

U.S. patent application Ser. No. 29/458,405 for an Electronic Device, filed Jun. 19, 2013 (Fitch et al.);

U.S. patent application Ser. No. 13/922,339 for a System and Method for Reading Code Symbols Using a Variable Field of View, filed Jun. 20, 2013 (Xian et al.);

U.S. patent application Ser. No. 13/927,398 for a Code Symbol Reading System Having Adaptive Autofocus, filed Jun. 26, 2013 (Todeschini);

U.S. patent application Ser. No. 13/930,913 for a Mobile Device Having an Improved User Interface for Reading Code Symbols, filed Jun. 28, 2013 (Gelay et al.);

U.S. patent application Ser. No. 29/459,620 for an Electronic Device Enclosure, filed Jul. 2, 2013 (London et al.);

U.S. patent application Ser. No. 29/459,681 for an Electronic Device Enclosure, filed Jul. 2, 2013 (Chaney et al.);

U.S. patent application Ser. No. 13/933,415 for an Electronic Device Case, filed Jul. 2, 2013 (London et al.);

U.S. patent application Ser. No. 29/459,785 for a Scanner and Charging Base, filed Jul. 3, 2013 (Fitch et al.);

U.S. patent application Ser. No. 29/459,823 for a Scanner, filed Jul. 3, 2013 (Zhou et al.);

U.S. patent application Ser. No. 13/947,296 for a System and Method for Selectively Reading Code Symbols, filed Jul. 22, 2013 (Rueblinger et al.);

U.S. patent application Ser. No. 13/950,544 for a Code Symbol Reading System Having Adjustable Object Detection, filed Jul. 25, 2013 (Jiang);

U.S. patent application Ser. No. 13/961,408 for a Method for Manufacturing Laser Scanners, filed Aug. 7, 2013 (Saber et al.);

U.S. patent application Ser. No. 14/018,729 for a Method for Operating a Laser Scanner, filed Sep. 5, 2013 (Feng et al.);

U.S. patent application Ser. No. 14/019,616 for a Device Having Light Source to Reduce Surface Pathogens, filed Sep. 6, 2013 (Todeschini);

U.S. patent application Ser. No. 14/023,762 for a Handheld Indicia Reader Having Locking Endcap, filed Sep. 11, 2013 (Gannon);

U.S. patent application Ser. No. 14/035,474 for Augmented-Reality Signature Capture, filed Sep. 24, 2013 (Todeschini);

U.S. patent application Ser. No. 29/468,118 for an Electronic Device Case, filed Sep. 26, 2013 (Oberpriller et al.);

U.S. patent application Ser. No. 14/055,234 for Dimensioning System, filed Oct. 16, 2013 (Fletcher);

U.S. patent application Ser. No. 14/053,314 for Indicia Reader, filed Oct. 14, 2013 (Huck);

U.S. patent application Ser. No. 14/065,768 for Hybrid System and Method for Reading Indicia, filed Oct. 29, 2013 (Meier et al.);

U.S. patent application Ser. No. 14/074,746 for Self-Checkout Shopping System, filed Nov. 8, 2013 (Hejl et al.);

U.S. patent application Ser. No. 14/074,787 for Method and System for Configuring Mobile Devices via NFC Technology, filed Nov. 8, 2013 (Smith et al.);

U.S. patent application Ser. No. 14/087,190 for Optimal Range Indicators for Bar Code Validation, filed Nov. 22, 2013 (Hejl);

U.S. patent application Ser. No. 14/094,087 for Method and System for Communicating Information in an Digital Signal, filed Dec. 2, 2013 (Peake et al.);

U.S. patent application Ser. No. 14/101,965 for High Dynamic-Range Indicia Reading System, filed Dec. 10, 2013 (Xian);

U.S. patent application Ser. No. 14/150,393 for Indicia-reader Having Unitary Construction Scanner, filed Jan. 8, 2014 (Colavito et al.);

U.S. patent application Ser. No. 14/154,207 for Laser Barcode Scanner, filed Jan. 14, 2014 (Hou et al.);

U.S. patent application Ser. No. 14/165,980 for System and Method for Measuring Irregular Objects with a Single Camera filed Jan. 28, 2014 (Li et al.);

U.S. patent application Ser. No. 14/166,103 for Indicia Reading Terminal Including Optical Filter filed Jan. 28, 2014 (Lu et al.);

U.S. patent application Ser. No. 14/200,405 for Indicia Reader for Size-Limited Applications filed Mar. 7, 2014 (Feng et al.);

U.S. patent application Ser. No. 14/231,898 for Hand-Mounted Indicia-Reading Device with Finger Motion Triggering filed Apr. 1, 2014 (Van Horn et al.);

U.S. patent application Ser. No. 14/250,923for Reading Apparatus Having Partial Frame Operating Mode filed Apr. 11, 2014, (Deng et al.);

U.S. patent application Ser. No. 14/257,174 for Imaging Terminal Having Data Compression filed Apr. 21, 2014, (Barber et al.);

U.S. patent application Ser. No. 14/257,364 for Docking System and Method Using Near Field Communication filed Apr. 21, 2014 (Showering);

U.S. patent application Ser. No. 14/264,173 for Autofocus Lens System for Indicia Readers filed Apr. 29, 2014 (Ackley et al.);

U.S. patent application Ser. No. 14/274,858 for Mobile Printer with Optional Battery Accessory filed May 12, 2014 (Marty et al.);

U.S. patent application Ser. No. 14/277,337 for MULTI-PURPOSE OPTICAL READER, filed May 14, 2014 (Jovanovski et al.);

U.S. patent application Ser. No. 14/283,282 for TERMINAL HAVING ILLUMINATION AND FOCUS CONTROL filed May 21, 2014 (Liu et al.);

U.S. patent application Ser. No. 14/300,276 for METHOD AND SYSTEM FOR CONSIDERING INFORMATION ABOUT AN EXPECTED RESPONSE WHEN PERFORMING SPEECH RECOGNITION, filed Jun. 10, 2014 (Braho et al.);

U.S. patent application Ser. No. 14/305,153 for INDICIA READING SYSTEM EMPLOYING DIGITAL GAIN CONTROL filed Jun. 16, 2014 (Xian et al.);

U.S. patent application Ser. No. 14/310,226 for AUTOFOCUSING OPTICAL IMAGING DEVICE filed Jun. 20, 2014 (Koziol et al.);

U.S. patent application Ser. No. 14/327,722 for CUSTOMER FACING IMAGING SYSTEMS AND METHODS FOR OBTAINING IMAGES filed Jul. 10, 2014 (Oberpriller et al,);

U.S. patent application Ser. No. 14/327,827 for a MOBILE-PHONE ADAPTER FOR ELECTRONIC TRANSACTIONS, filed Jul. 10, 2014 (Hejl);

U.S. patent application Ser. No. 14/329,303 for CELL PHONE READING MODE USING IMAGE TIMER filed Jul. 11, 2014 (Coyle);

U.S. patent application Ser. No. 14/333,588 for SYMBOL READING SYSTEM WITH INTEGRATED SCALE BASE filed Jul. 17, 2014 (Barten);

U.S. patent application Ser. No. 14/334,934 for a SYSTEM AND METHOD FOR INDICIA VERIFICATION, filed Jul. 18, 2014 (Hejl);

U.S. patent application Ser. No. 14/336,188 for METHOD OF AND SYSTEM FOR DETECTING OBJECT WEIGHING INTERFERENCES, Filed Jul. 21, 2014 (Amundsen et al.);

U.S. patent application Ser. No. 14/339,708 for LASER SCANNING CODE SYMBOL READING SYSTEM, filed Jul. 24, 2014 (Xian et al.);

U.S. patent application Ser. No. 14/340,627 for an AXIALLY REINFORCED FLEXIBLE SCAN ELEMENT, filed Jul. 25, 2014 (Rueblinger et al.);

U.S. patent application Ser. No. 14/340,716 for an OPTICAL IMAGER AND METHOD FOR CORRELATING A MEDICATION PACKAGE WITH A PATIENT, filed Jul. 25, 2014 (Ellis);

U.S. patent application Ser. No. 14/342,544 for Imaging Based Barcode Scanner Engine with Multiple Elements Supported on a Common Printed Circuit Board filed Mar. 4, 2014 (Liu et al.);

U.S. patent application Ser. No. 14/345,735 for Optical Indicia Reading Terminal with Combined Illumination filed Mar. 19, 2014 (Ouyang);

U.S. patent application Ser. No. 14/336,188 for METHOD OF AND SYSTEM FOR DETECTING OBJECT WEIGHING INTERFERENCES, Filed Jul. 21, 2014 (Amundsen et al.);

U.S. patent application Ser. No. 14/355,613 for Optical Indicia Reading Terminal with Color Image Sensor filed May 1, 2014 (Lu et al.);

U.S. patent application Ser. No. 14/370,237 for WEB-BASED SCAN-TASK ENABLED SYSTEM AND METHOD OF AND APPARATUS FOR DEVELOPING AND DEPLOYING THE SAME ON A CLIENT-SERVER NETWORK filed Jul. 2, 2014 (Chen et al.);

U.S. patent application Ser. No. 14/370,267 for INDUSTRIAL DESIGN FOR CONSUMER DEVICE BASED SCANNING AND MOBILITY, filed Jul. 2, 2014 (Ma et al.);

U.S. patent application Ser. No. 14/376,472, for an ENCODED INFORMATION READING TERMINAL INCLUDING HTTP SERVER, filed Aug. 4, 2014 (Lu);

U.S. patent application Ser. No. 14/379,057 for METHOD OF USING CAMERA SENSOR INTERFACE TO TRANSFER MULTIPLE CHANNELS OF SCAN DATA USING AN IMAGE FORMAT filed Aug. 15, 2014 (Wang et al.);

U.S. patent application Ser. No. 14/452,697 for INTERACTIVE INDICIA READER, filed Aug. 6, 2014 (Todeschini);

U.S. patent application Ser. No. 14/453,019 for DIMENSIONING SYSTEM WITH GUIDED ALIGNMENT, filed Aug. 6, 2014 (Li et al.);

U.S. patent application Ser. No. 14/460,387 for APPARATUS FOR DISPLAYING BAR CODES FROM LIGHT EMITTING DISPLAY SURFACES filed Aug. 15, 2014 (Van Horn et al.);

U.S. patent application Ser. No. 14/460,829 for ENCODED INFORMATION READING TERMINAL WITH WIRELESS PATH SELECTION CAPABILITY, filed Aug. 15, 2014 (Wang et al.);

U.S. patent application Ser. No. 14/462,801 for MOBILE COMPUTING DEVICE WITH DATA COGNITION SOFTWARE, filed on Aug. 19, 2014 (Todeschini et al.);

U.S. patent application Ser. No.14/446,387 for INDICIA READING TERMINAL PROCESSING PLURALITY OF FRAMES OF IMAGE DATA RESPONSIVELY TO TRIGGER SIGNAL ACTIVATION filed Jul. 30, 2014 (Wang et al.);

U.S. patent application Ser. No. 14/446,391 for MULTI-FUNCTION POINT OF SALE APPARATUS WITH OPTICAL SIGNATURE CAPTURE filed Jul. 30, 2014 (Good et al.);

U.S. patent application Ser. No. 29/486,759 for an Imaging Terminal, filed Apr. 2, 2014 (Oberpriller et al.);

U.S. patent application Ser. No. 29/492,903 for an INDICIA SCANNER, filed Jun. 4, 2014 (Zhou et al.); and U.S. patent application Ser. No. 29/494,725 for an IN-COUNTER BARCODE SCANNER, filed Jun. 24, 2014 (Oberpriller et al.).

* * *

The present invention is not limited to such example embodiments. Embodiments of the present invention also relate to equivalents of the examples described herein. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

An exemplary embodiment, relates to a system for providing power to a mobile device, the system comprising:
a battery component operable for energizing the mobile device power system; and
an integrated circuit (IC) gas gauge component, the IC gas gauge component operable for managing an operating state of the
battery component and comprising:
a semiconductor substrate; and
a plurality of active elements disposed upon the substrate wherein at least a portion of the plurality of active elements is operable, based on instructions with which the at least portion of the active elements is configured or programmed, for tracking a capacity aging of the battery, the tracking the battery capacity aging comprising:
targeting an event, comprising one or more of reaching an end of a discharge state of the battery, or reaching a midpoint of a charging state of the battery, the midpoint relative to a full charge on the battery; and
inducing a relaxation state in the battery upon the targeted event.

An example embodiment of the present invention relates to a method for managing a mobile device battery operating state. Active elements of the gas gauge IC component of the mobile device are configured and/or programmed based on instructions, which relate to tracking capacity aging of the battery. An event is targeted based on the configured or programmed instructions. The targeted event corresponds to reaching an end of a discharge state of the battery, or to reaching a midpoint (relative to a full charge) of a charging state of the battery. A relaxation state is induced in the battery upon the targeted event occurring. Example embodiments also relate to a power system for a mobile device, a gas gauge IC chip for mobile devices, and a mobile device.

What is claimed, is:

1. A method for managing an operating state of a battery energizing a mobile device, the method comprising:
inducing a first induced relaxation state in the battery upon an occurrence of a first event, wherein the first event corresponds to an end of discharge of the battery;
sensing a first voltage level of the battery during the first induced relaxation state when a rate of change of the first voltage level meets a voltage stability threshold during the first induced relaxation state;
releasing the battery from the first induced relaxation state;
charging the battery to at least 30 percent of an original capacity of the battery over a continuous time span, reaching a midpoint of a charging state of the battery, the midpoint relative to a full charge state of the battery;
inducing a second induced relaxation state in response to occurrence of a second event, wherein the second event corresponds to the charging state of the battery reaching the midpoint;
sensing a second voltage level of the battery during the second induced relaxation state when the rate of change of the second voltage level meets the voltage stability threshold during the second induced relaxation state; and
calibrating a capacity of the battery based on the first voltage level and the second voltage level, wherein the calibration comprises updating or a correcting the capacity of the battery.

2. The method as described in claim 1 further comprises setting a value corresponding to one or more of a full battery charge state or a battery charging state mid-point.

3. The method as described in claim 1, wherein the first event occurs when the mobile device couples to a docking station operable for charging the battery.

4. The method as described in claim 1, further comprising sustaining a relaxation state, wherein the relaxation state corresponds to at least one of the first induced relaxation state or the second induced relaxation state.

5. The method as described in claim 4, wherein the sustaining further comprises:
sensing a voltage level of the battery during the relaxation state;
computing a rate of change of the sensed voltage level; and
deterring a release of the battery from the relaxation state until the computed rate of change of the sensed voltage level meets the voltage stability threshold.

6. The method as described in claim 1, wherein the voltage stability threshold comprises a maximum allowable rate of change of the voltage level.

7. The method as described in claim 6, wherein the voltage stability threshold corresponds to the maximum allowable rate of one Microvolt per second.

8. The method as described in claim 1, wherein the capacity of the battery is calibrated during the second induced relaxation state.

9. The method as described in claim 1, further comprising validating, during the first induced relaxation state and the second induced relaxation state, a voltage level of the battery as comprising a value between, a fifth of a full charge battery voltage level and a half of the full charge battery voltage level, inclusive, wherein the calibrating is performed in response to completion of the validating.

10. The method as described in claim 1, wherein the first voltage level and the second voltage level span a range of, a fifth of a full charge battery voltage level and a half of the full charge battery voltage level, inclusive.

11. An integrated circuit (IC) gas gauge component for a mobile device energized by a battery component, the IC gas gauge component operable for managing an operating state of the battery component and comprising:
a semiconductor substrate; and a plurality of active elements disposed upon the semiconductor substrate, wherein at least a portion of the plurality of active elements is operable, based on instructions with which the portion is configured or programmed, for tracking a capacity of the battery component, the tracking the battery component capacity comprising:

inducing a first induced relaxation state in the battery component upon a first event, wherein the first event corresponds to an end of discharge of the battery;

sensing a first voltage level of the battery component during the first induced relaxation state when a rate of change of the first voltage level meets a voltage stability threshold during the first induced relaxation state;

releasing the battery component from the first induced relaxation state;

charging the battery component to at least 30 percent of an original capacity of the battery component over a continuous time span, reaching a midpoint of a charging state of the battery component, the midpoint relative to a full charge state of the battery component;

inducing a second induced relaxation state in response to occurrence of a second event, wherein the second event corresponds to the charging state of the battery component reaching the midpoint;

sensing a second voltage level of the battery component during the second induced relaxation state when the rate of change of the second voltage level meets the voltage stability threshold during the second induced relaxation state; and calibrating a capacity of the battery component based on the first voltage level and the second voltage level, wherein the calibrating the capacity of the battery component comprises updating or correcting the capacity of the battery component.

12. The IC gas gauge component as described in claim 11, wherein the instructions with which the portion of the active elements are configured or programmed to setting a value corresponding to one or more of a full battery charge or a battery charging state mid-point.

13. The IC gas gauge component as described in claim 11, wherein tracking the capacity of the battery component further comprises sustaining a relaxation state, wherein the relaxation state corresponds to at least one of the first induced relaxation state or the second induced relaxation state.

14. The IC gas gauge component as described in claim 13, wherein sustaining the relaxation state comprises:

sensing a voltage level of the battery component during the relaxation state;

computing a rate of change of the sensed voltage level; and deterring a release of the battery component from the relaxation state until the computed rate of change of the sensed voltage level meets the voltage stability threshold.

15. The IC gas gauge component as described in claim 11 is configured to calibrate the capacity of the battery component during the second induced relaxation state.

16. A non-transitory computer readable storage medium comprising instructions, which when executed by a computer processor cause or control a performance of a method for managing an operating state of a battery energizing a mobile device, the method comprising:

inducing a first induced relaxation state in the battery upon an occurrence of a first event, wherein the first event corresponds to an end of discharge of the battery;

sensing a first voltage level of the battery during the first induced relaxation state when a rate of change of the first voltage level meets a voltage stability threshold during the first induced relaxation state;

releasing the battery from the induced relaxation state;

charging the battery to at least 30 percent of an original capacity of the battery over a continuous time span, reaching a midpoint of a charging state of the battery, the midpoint relative to a full charge state of the battery;

inducing a second induced relaxation state upon occurrence of a second event, wherein the second event corresponds to the charging state of the battery reaching the midpoint;

sensing a second voltage level of the battery during the second induced relaxation state when the rate of change of the second voltage level meets the voltage stability threshold during the second induced relaxation state; and calibrating a capacity of the battery based on the first voltage level and the second voltage level, wherein the calibrating the capacity of the battery comprises updating or correcting the capacity of the battery.

17. The non-transitory computer readable storage medium as described in claim 16, wherein the method further comprises one or more of a full battery charge or a battery charging state mid-point.

18. The non-transitory computer readable storage medium as described in claim 16, wherein the method comprises:

sustaining an induced relaxation state until a rate of change of a sensed voltage level meets the voltage stability threshold, wherein the induced relaxation state corresponds to at least one of the first induced relaxation state or the second induced relaxation state.

19. The non-transitory computer readable storage medium as described in claim 16, wherein the first voltage level and the second voltage level span in a range of, a fifth of a full charge battery voltage level and a half of the full charge battery voltage level, inclusive.

20. The non-transitory computer readable storage medium as described in claim 16, wherein the capacity of the battery is calibrated during the second induced relaxation state.

* * * * *